(12) United States Patent
Kim et al.

(10) Patent No.: US 11,295,958 B2
(45) Date of Patent: Apr. 5, 2022

(54) METHODS OF FORMING A SEMICONDUCTOR DEVICE INCLUDING ACTIVE PATTERNS ON A BONDING LAYER AND SEMICONDUCTOR DEVICES FORMED BY THE SAME

(71) Applicant: Samsung Electronics Co., Ltd., Suwon-si (KR)

(72) Inventors: Sungmin Kim, Incheon (KR); Daewon Ha, Seoul (KR)

(73) Assignee: Samsung Electronics Co., Ltd.

( * ) Notice: Subject to any disclaimer, the term of this patent is extended or adjusted under 35 U.S.C. 154(b) by 229 days.

(21) Appl. No.: 16/683,404

(22) Filed: Nov. 14, 2019

(65) Prior Publication Data
US 2020/0388502 A1    Dec. 10, 2020

(30) Foreign Application Priority Data

Jun. 10, 2019    (KR) .......................... 10-2019-0067894

(51) Int. Cl.
| | |
|---|---|
| *H01L 21/306* | (2006.01) |
| *H01L 21/20* | (2006.01) |
| *H01L 21/3105* | (2006.01) |
| *H01L 21/762* | (2006.01) |
| *H01L 21/84* | (2006.01) |

(52) U.S. Cl.
CPC .... *H01L 21/30625* (2013.01); *H01L 21/2007* (2013.01); *H01L 21/31051* (2013.01); *H01L 21/76251* (2013.01); *H01L 21/76264* (2013.01); *H01L 21/845* (2013.01)

(58) Field of Classification Search
CPC ........... H01L 21/30625; H01L 21/2007; H01L 21/31051; H01L 21/76251; H01L 21/76264; H01L 21/845; H01L 29/66818; H01L 29/0649; H01L 29/16; H01L 29/161; H01L 29/201; H01L 29/34; H01L 24/07

See application file for complete search history.

(56) References Cited

U.S. PATENT DOCUMENTS

| | | | |
|---|---|---|---|
| 9,355,889 | B2 | 5/2016 | Waldron |
| 9,716,174 | B2 | 7/2017 | Akarvardar et al. |
| 9,761,609 | B2 | 9/2017 | Mochizuki et al. |
| 9,786,546 | B1 | 10/2017 | Hook et al. |
| 9,911,663 | B2 | 3/2018 | Rim et al. |
| 10,068,920 | B2 | 9/2018 | Reznicek et al. |
| 2017/0148688 | A1 | 5/2017 | Rim et al. |
| 2018/0158841 | A1 | 6/2018 | Glass et al. |

*Primary Examiner* — Dale E Page
*Assistant Examiner* — Quovaunda Jefferson
(74) *Attorney, Agent, or Firm* — Myers Bigel, P.A.

(57) ABSTRACT

Methods of forming a semiconductor device and semiconductor device formed by the methods are provided. The methods of forming a semiconductor device may include providing a first substrate and a first bonding layer that is provided on the first substrate, forming a sacrificial pattern and an active pattern on a second substrate, forming a second bonding layer on the active pattern, bonding the second bonding layer onto the first bonding layer, removing the second substrate, and removing the sacrificial pattern to expose the active pattern. Forming the sacrificial pattern and the active pattern on the second substrate may include forming a preliminary sacrificial pattern and the active pattern on the second substrate and oxidizing the preliminary sacrificial pattern. The preliminary sacrificial pattern and the active pattern may be sequentially stacked on the second substrate.

19 Claims, 25 Drawing Sheets

US 11,295,958 B2

METHODS OF FORMING A SEMICONDUCTOR DEVICE INCLUDING ACTIVE PATTERNS ON A BONDING LAYER AND SEMICONDUCTOR DEVICES FORMED BY THE SAME

CROSS-REFERENCE TO RELATED APPLICATION

This U.S. non-provisional patent application claims priority under 35 U.S.C. § 119 to Korean Patent Application No. 10-2019-0067894, filed on Jun. 10, 2019, in the Korean Intellectual Property Office (KIPO), the disclosure of which is incorporated herein by reference in its entirety.

FIELD

The present disclosure generally relates to the field of electronics and, more particularly, to semiconductor devices including active patterns on a bonding layer and methods of forming the same.

BACKGROUND

With an increase in the integration density of semiconductor devices, processes for bonding a plurality of wafers to each other have been developed. The processes may include bonding a second wafer onto a first wafer and partially removing the second wafer to reduce a thickness of the second wafer. Developing improved processes for reducing the thickness of the second wafer may be beneficial.

SUMMARY

Example embodiments of the inventive concept are directed to methods of forming a semiconductor device, which has improved electrical characteristics and is advantageous for increasing mass production efficiency, and semiconductor devices formed using the methods.

According to example embodiments, methods of forming a semiconductor device are provided. The methods may include providing a first substrate and a first bonding layer that is provided on the first substrate, forming a sacrificial pattern and an active pattern on a second substrate, forming a second bonding layer on the active pattern, bonding the second bonding layer onto the first bonding layer, removing the second substrate, and removing the sacrificial pattern to expose the active pattern. Forming the sacrificial pattern and the active pattern on the second substrate may include forming a preliminary sacrificial pattern and the active pattern on the second substrate and oxidizing the preliminary sacrificial pattern. The preliminary sacrificial pattern and the active pattern may be sequentially stacked on the second substrate.

According to example embodiments, methods of forming a semiconductor device are provided. The methods may include providing a first substrate and a first bonding layer that is provided on the first substrate, forming a sacrificial pattern and an active pattern on a second substrate, forming a second bonding layer on the active pattern, bonding the second bonding layer onto the first bonding layer, removing the second substrate, and removing the sacrificial pattern to expose the active pattern. Forming the sacrificial pattern and the active pattern on the second substrate may include sequentially forming a sacrificial layer and an active layer on the second substrate using a first epitaxial growth process, patterning the sacrificial layer and the active layer to form a preliminary sacrificial pattern and the active pattern, and oxidizing the preliminary sacrificial pattern.

According to example embodiments, methods of forming a semiconductor device are provided. The methods may include providing a first substrate and a first bonding layer that is provided on the first substrate and forming a plurality of sacrificial patterns and a plurality of active patterns on a second substrate. The plurality of sacrificial patterns and the plurality of active patterns may be alternately stacked on the second substrate. The methods may also include forming a second bonding layer on the plurality of active patterns, bonding the second bonding layer onto the first bonding layer, removing the second substrate, removing the plurality of sacrificial patterns, and forming a gate electrode that traverses the plurality of active patterns. The gate electrode may extend between the plurality of active patterns. Forming the plurality of sacrificial patterns and the plurality of active patterns on the second substrate may include forming a plurality of sacrificial layers and a plurality of active layers on the second substrate using an epitaxial growth process, patterning the plurality of sacrificial layers and the plurality of active layers to form a plurality of preliminary sacrificial patterns and the plurality of active patterns, and oxidizing the plurality of preliminary sacrificial patterns. The plurality of sacrificial layers and the plurality of active layers are alternately stacked on the second substrate.

According to example embodiments, semiconductor devices are provided. The semiconductor devices may include a first bonding layer on a substrate, a second bonding layer on the first bonding layer, a plurality of active patterns stacked on the second bonding layer, and a gate electrode that traverses the plurality of active patterns. The gate electrode may extend between the plurality of active patterns. The plurality of active patterns may include a first active pattern on the second bonding layer, and a second active pattern between the second bonding layer and the first active pattern. A widest width of the second active pattern is smaller than a widest width of the first active pattern.

According to example embodiments, semiconductor devices are provided. The semiconductor devices may include a first bonding layer on a substrate, a second bonding layer on the first bonding layer, an active pattern on the second bonding layer, and a gate electrode that traverses the active pattern. The active pattern may have a width that decreases in a first direction toward the second bonding layer.

According to example embodiments, methods of forming a semiconductor device are provided. The methods may include providing a first substrate and a first bonding layer that is provided on the first substrate, and sequentially forming a sacrificial pattern, an active pattern, and a second bonding layer on a second substrate. The second substrate may include a first portion and a second portion extending between the first portion of the second substrate and the sacrificial pattern. The method may also include bonding the second bonding layer onto the first bonding layer, removing the first portion of the second substrate using a first process and then removing the second portion of the second substrate using a second process until the sacrificial pattern is exposed, and removing the sacrificial pattern until the active pattern is exposed.

DETAILED DESCRIPTION

FIGS. 1 to 9 are cross-sectional views of semiconductor devices according to example embodiments of the inventive concept. The semiconductor devices may include a fin on insulator (FOI) structure.

Figure 1:
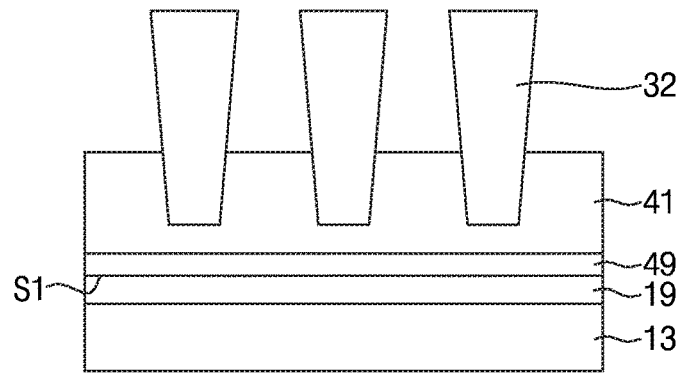
FIGS. 1 to 9 are cross-sectional views of semiconductor devices according to example embodiments of the inventive concept.

Referring to FIG. 1, a semiconductor device may include a first substrate 13, a first bonding layer 19, a second bonding layer 49, a device isolation layer 41, and a plurality of active patterns 32. The first bonding layer 19 may be disposed on the first substrate 13. The second bonding layer 49 may be disposed on the first bonding layer 19. An interface S1 may be formed between the first bonding layer 19 and the second bonding layer 49. The device isolation layer 41 and the plurality of active patterns 32 may be disposed on the second bonding layer 49.

An upper surface of the device isolation layer 41 may be disposed at a lower level than upper ends of the plurality of active patterns 32. Upper surfaces of the plurality of active patterns 32 may be disposed at a higher level than the device isolation layer 41. At least portions of side surfaces of the plurality of active patterns 32 may be disposed at a higher level than the device isolation layer 41. Each of the plurality of active patterns 32 may extend into the device isolation layer 41. Each of the plurality of active patterns 32 may have a reverse trapezoidal shape having an upper width greater than a lower width thereof as illustrated in FIG. 1. Each of the plurality of active patterns 32 may have a width that decreases (e.g., monotonically decrease) in a direction toward the interface S1. Each of the plurality of active patterns 32 may have a vertical height greater than a lateral width thereof. The plurality of active patterns 32 may each include, for example, a silicon (Si) layer. In some embodiments, each of the plurality of active patterns 32 may protrude beyond the upper surface of the device isolation layer 41 as illustrated in FIG. 1 and may include a portion in the device isolation layer 41.

Figure 2:
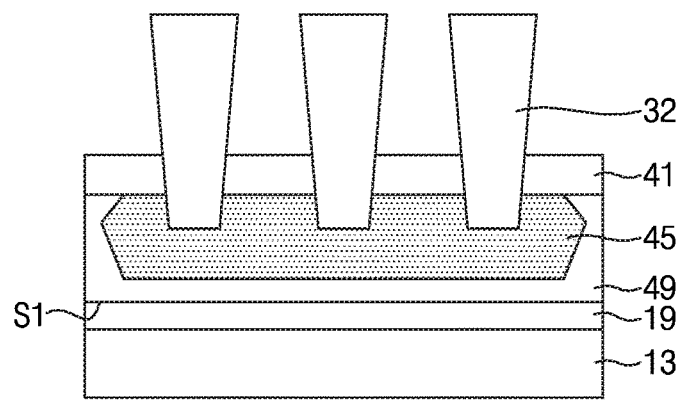

Referring to FIG. 2, a semiconductor device may include a first substrate 13, a first bonding layer 19, a second bonding layer 49, a stressor 45, a device isolation layer 41, and a plurality of active patterns 32.

The stressor 45 may be disposed on the second bonding layer 49. The stressor 45 may be disposed between the second bonding layer 49 and the device isolation layer 41. Each of the plurality of active patterns 32 may pass through the device isolation layer 41 and may extend into the stressor 45. The stressor 45 may be in direct contact with lower surfaces and side surfaces of the plurality of active patterns 32. The stressor 45 may include, for example, a silicon germanium (SiGe) layer, a silicon carbide (SiC) layer, a silicon (Si) layer, or a combination thereof.

Figure 3:
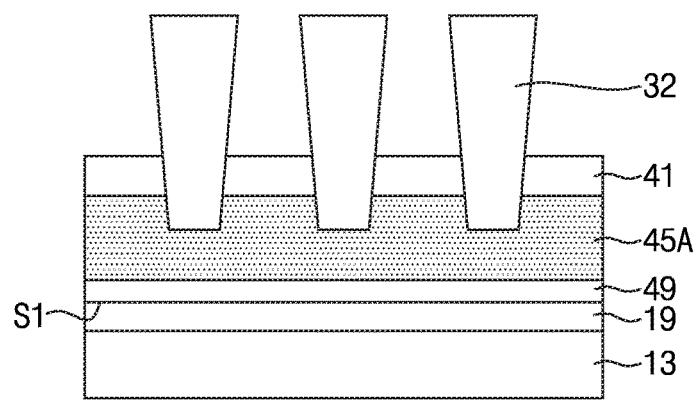

Referring to FIG. 3, a semiconductor device may include a first substrate 13, a first bonding layer 19, a second bonding layer 49, a stressor 45A, a device isolation layer 41, and a plurality of active patterns 32. The stressor 45A may include, for example, a silicon nitride layer, a silicon oxynitride layer, or a combination thereof.

Figure 4:
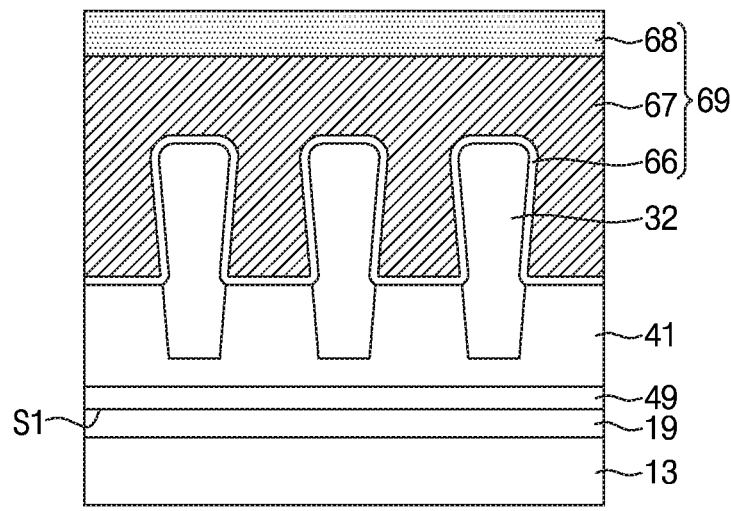

Referring to FIG. 4, a semiconductor device may include a first substrate 13, a first bonding layer 19, a second bonding layer 49, a device isolation layer 41, a plurality of active patterns 32, and a gate structure 69. The gate structure 69 may include a gate dielectric layer 66, a gate electrode 67, and a capping layer 68, which are sequentially stacked on the device isolation layer 41. The gate structure 69 may be disposed on the plurality of active patterns 32 and the device isolation layer 41.

Figure 5:
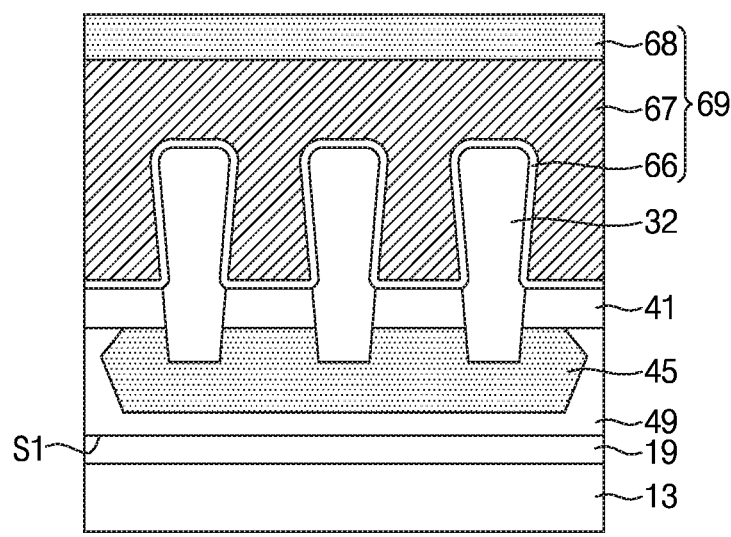

Referring to FIG. 5, a semiconductor device may include a first substrate 13, a first bonding layer 19, a second bonding layer 49, a stressor 45, a device isolation layer 41, a plurality of active patterns 32, and a gate structure 69.

Figure 6:
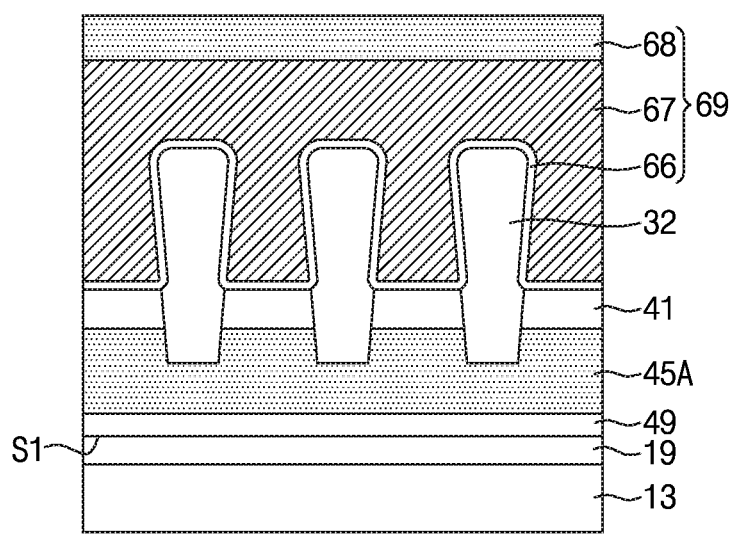

Referring to FIG. 6, a semiconductor device may include a first substrate 13, a first bonding layer 19, a second bonding layer 49, a stressor 45A, a device isolation layer 41, a plurality of active patterns 32, and a gate structure 69.

Figure 7:
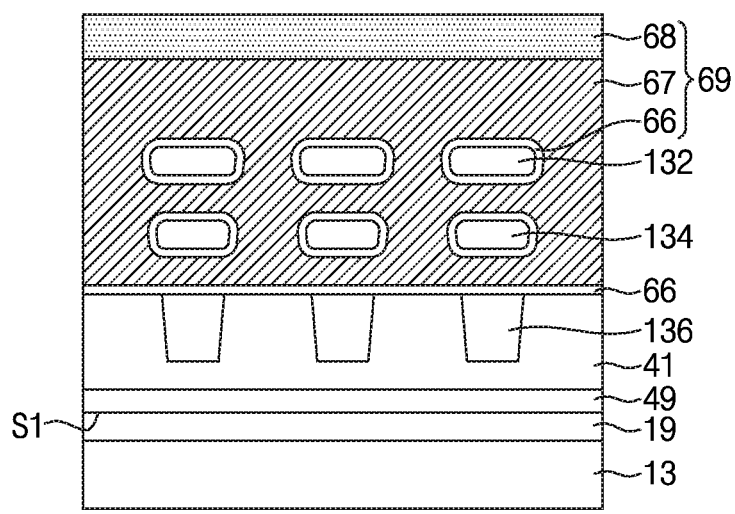

Referring to FIG. 7, a semiconductor device may include a first substrate 13, a first bonding layer 19, a second bonding layer 49, a device isolation layer 41, a plurality of active patterns 132, 134, and 136, and a gate structure 69. The plurality of active patterns 132, 134, and 136 may include a plurality of first active patterns 132, a plurality of second active patterns 134, and a plurality of third active patterns 136.

In some embodiments, the plurality of active patterns 132, 134, and 136 may be sequentially stacked on the second bonding layer 49. The plurality of active patterns 132, 134, and 136 may include a first active pattern 132 disposed farthest apart from the interface S1 between the first bonding layer 19 and the second bonding layer 49, a second active pattern 134 between the interface S1 and the first active pattern 132, and a third active pattern 136 disposed closest to the interface S1. A greatest width of the second active pattern 134 may be smaller than a greatest width of the first active pattern 132. The third active pattern 136 may have a width that decreases in a direction toward the interface S1. The third active pattern 136 may extend into the device isolation layer 41. In some embodiments, a width of the second active pattern 134 may be smaller than a width of the first active pattern 132, as illustrated in FIG. 7. In some embodiments, the plurality of third active patterns 136 may be in the device isolation layer 41.

The gate electrode 67 may be disposed on the plurality of active patterns 132, 134, and 136. The gate electrode 67 may extend among the plurality of active patterns 132, 134, and 136. In some embodiment, the gate electrode 67 may surround upper surfaces, lower surfaces, and side surfaces of the plurality of first active patterns 132 and surround upper surfaces, lower surfaces, and side surfaces of the plurality of second active patterns 134. In some embodiments, the gate electrode 67 may completely enclose the plurality of first active patterns 132 and the plurality of second active patterns 134 as illustrated in FIG. 7.

Figure 8:
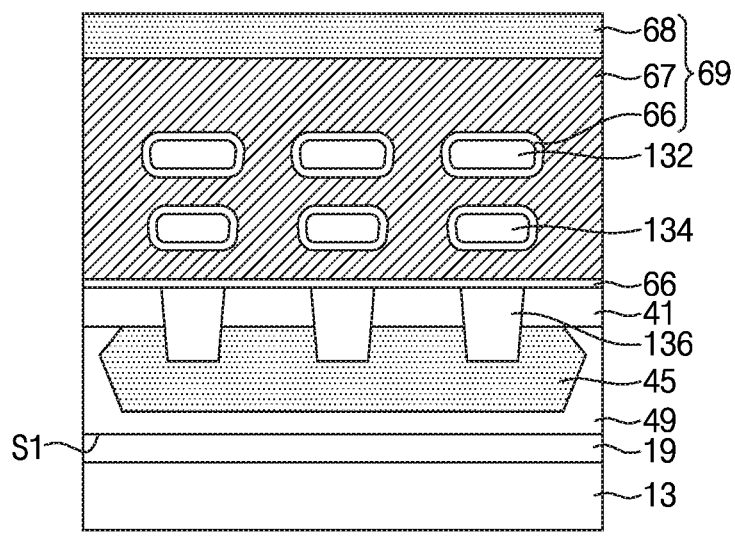

Referring to FIG. 8, a semiconductor device may include a first substrate 13, a first bonding layer 19, a second bonding layer 49, a stressor 45, a device isolation layer 41, a plurality of active patterns 132, 134, and 136, and a gate structure 69. Each of a plurality of third active patterns 136 may pass through the device isolation layers 41 and extend into the stressor 45. The stressor 45 may be in direct contact with lower surfaces and side surfaces of the plurality of third active patterns 136.

Figure 9:
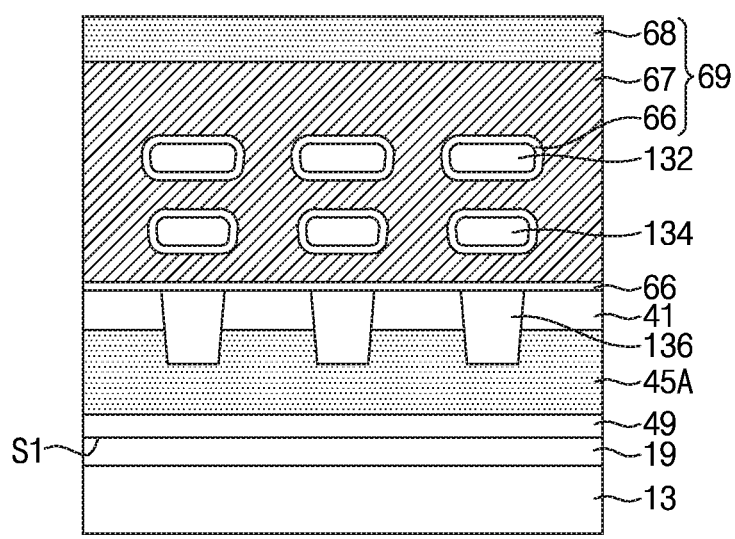

Referring to FIG. 9, a semiconductor device may include a first substrate 13, a first bonding layer 19, a second bonding layer 49, a stressor 45A, a device isolation layer 41, a plurality of active patterns 132, 134, and 136, and a gate structure 69.

Figure 10:
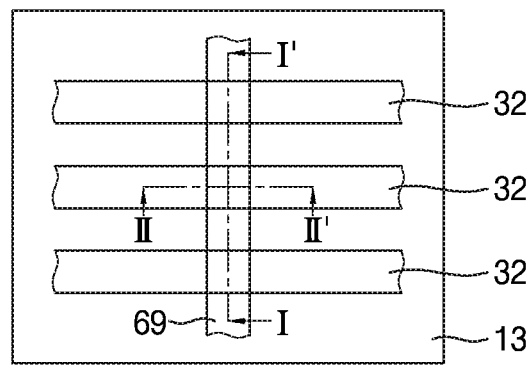
FIG. 10 is a layout of a semiconductor device according to an example embodiment of the inventive concept.

FIG. 10 is a layout of a semiconductor device according to an example embodiment of the inventive concept, and FIGS. 11 to 28 are cross-sectional views taken along lines I-I' and II-II' of FIG. 10 that illustrate a method of forming the semiconductor device shown in FIG. 10.

Figure 11:
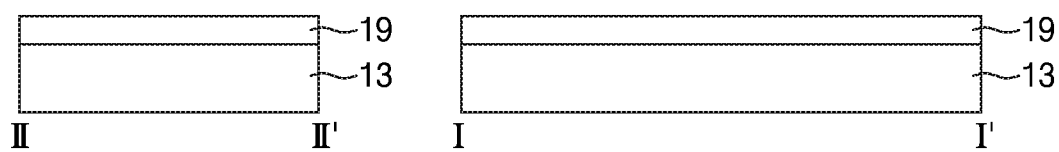
FIGS. 11 to 39 are cross-sectional views taken along lines I-I' and II-II' of FIG. 10 that illustrate a method of forming a semiconductor device according to example embodiments of the inventive concept.

Referring to FIGS. 10 and 11, a first substrate 13 including a first bonding layer 19 may be provided. The first substrate 13 may include a semiconductor substrate such as a silicon wafer. The first bonding layer 19 may include, for example, silicon oxide, silicon nitride, silicon oxynitride, or a combination thereof. In some embodiments, the first bonding layer 19 may include, for example, a silicon oxide layer. The first bonding layer 19 may cover the first substrate 13. An upper surface of the first bonding layer 19 may be planarized. It will be understood that "an element A covers an element B" (or similar language) means that the element A is on the element B but does not necessarily mean that the element A covers the element B entirely.

Figure 12:
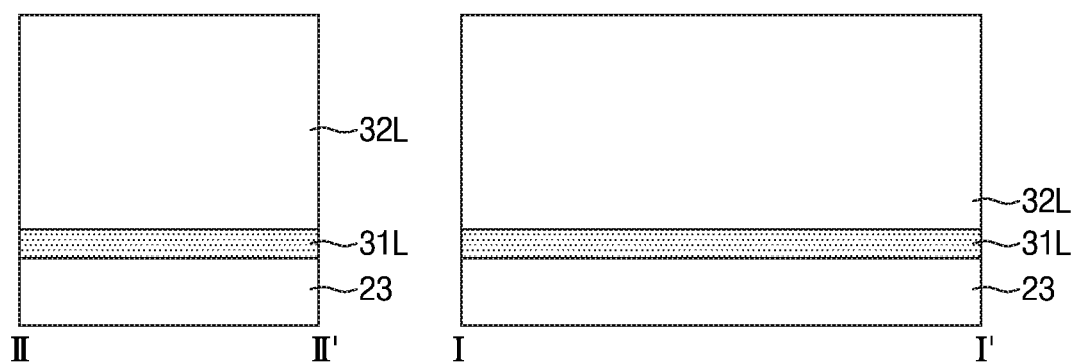

Referring to FIGS. 10 and 12, a sacrificial layer 31L and an active layer 32L may be sequentially formed on a second substrate 23.

The second substrate 23 may include a semiconductor substrate such as a silicon wafer. The sacrificial layer 31L and the active layer 32L may be formed using, for example, a first epitaxial growth process. The sacrificial layer 31L may cover the second substrate 23. The active layer 32L may cover the sacrificial layer 31L. The sacrificial layer 31L may be interposed between the second substrate 23 and the active layer 32L. The sacrificial layer 31L may include a different material from the second substrate 23 and the active layer 32L. In some embodiments, the sacrificial layer 31L may include, for example, a SiGe layer, and the active layer 32L may include, for example, a Si layer.

Figure 13:
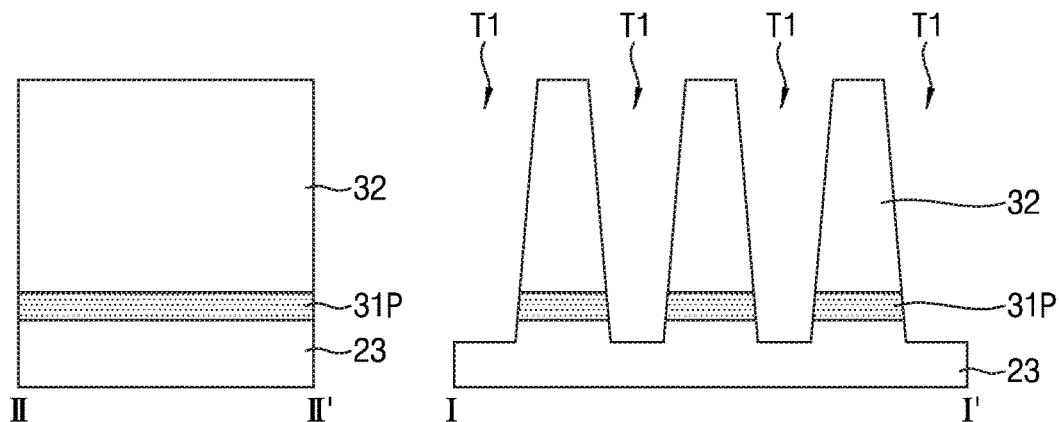

Referring to FIGS. 10 and 13, the active layer 32L and the sacrificial layer 31L may be patterned, thereby forming a plurality of trenches T1 that define a plurality of active patterns 32 and a plurality of preliminary sacrificial patterns 31P. The plurality of preliminary sacrificial patterns 31P may include, for example, a SiGe layer.

Bottom surfaces of the plurality of trenches T1 may be at a lower level than lowermost ends of the plurality of preliminary sacrificial patterns 31P as illustrated in FIG. 13. The bottom surfaces of the plurality of trenches T1 may be at a lower level than an upper surface of the second substrate 23. Each of the plurality of trenches T1 may have a lower width smaller than an upper width thereof. Each of the plurality of active patterns 32 and the plurality of preliminary sacrificial patterns 31P may have an upper width smaller than a lower width thereof. The plurality of trenches T1 may be parallel to each other. Each of the plurality of trenches T1 may have a vertical height greater than a lateral width thereof. The plurality of active patterns 32 may be parallel to each other. Each of the plurality of active patterns 32 may have a vertical height greater than a lateral width thereof.

Figure 14:
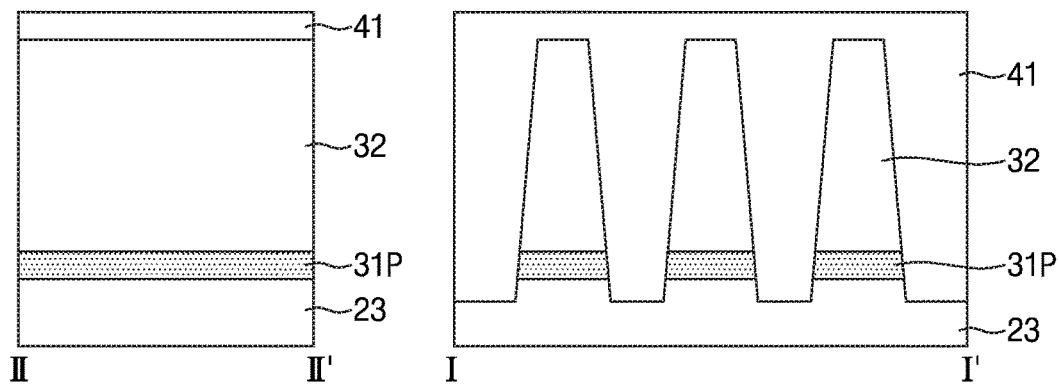

Referring to FIGS. 10 and 14, a device isolation layer 41 may be formed on the second substrate 23 including the plurality of preliminary sacrificial patterns 31P and the plurality of active patterns 32. The device isolation layer 41 may fill (e.g., completely fill or partially fill) the plurality of trenches T1 and cover the plurality of active patterns 32 and the plurality of preliminary sacrificial patterns 31P. The device isolation layer 41 may be in direct contact with side surfaces of the plurality of active patterns 32 and the plurality of preliminary sacrificial patterns 31P. The device isolation layer 41 may include silicon oxide, silicon nitride, silicon oxynitride, a low-k dielectric, or a combination thereof.

Figure 15:
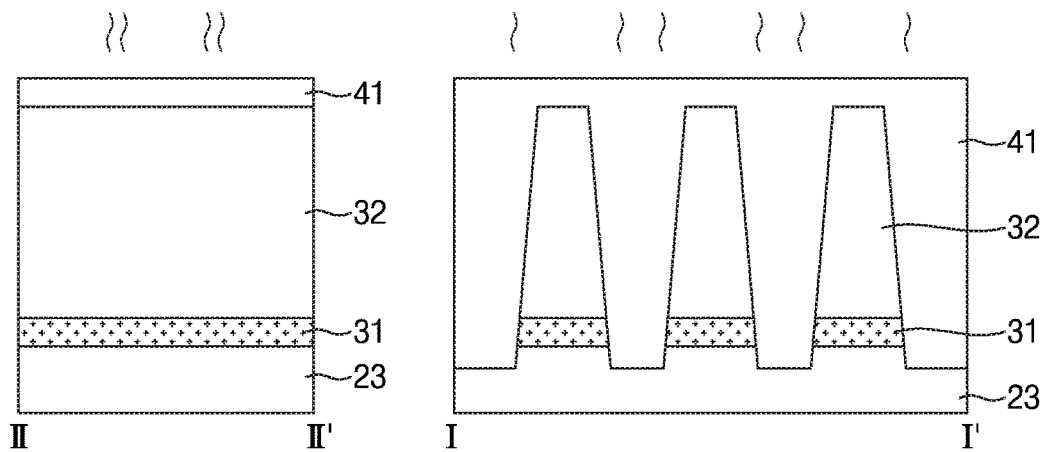

Referring to FIGS. 10 and 15, the preliminary sacrificial patterns 31P may be oxidized to form a plurality of sacrificial patterns 31. The plurality of sacrificial patterns 31 may include, for example, a silicon germanium oxide (SiGeO) layer. The plurality of active patterns 32 may each include, for example, a Si layer.

The oxidation of the plurality of preliminary sacrificial patterns 31P may include performing, for example, a selective oxidation process. In some embodiments, the oxidation of the plurality of preliminary sacrificial patterns 31P may include supplying $O_2$, $H_2$, $H_2O$, or a combination thereof onto the second substrate 23 including the plurality of active patterns 32, the plurality of preliminary sacrificial patterns 31P, and the device isolation layer 41 in an atmosphere at a temperature of 300° C. to 1000° C. The plurality of preliminary sacrificial patterns 31P may exhibit a higher oxidation rate than the plurality of active patterns 32. In some embodiments, an oxidation rate of the plurality of preliminary sacrificial patterns 31P may be about 1.5 times that of the plurality of active patterns 32.

Figure 16:
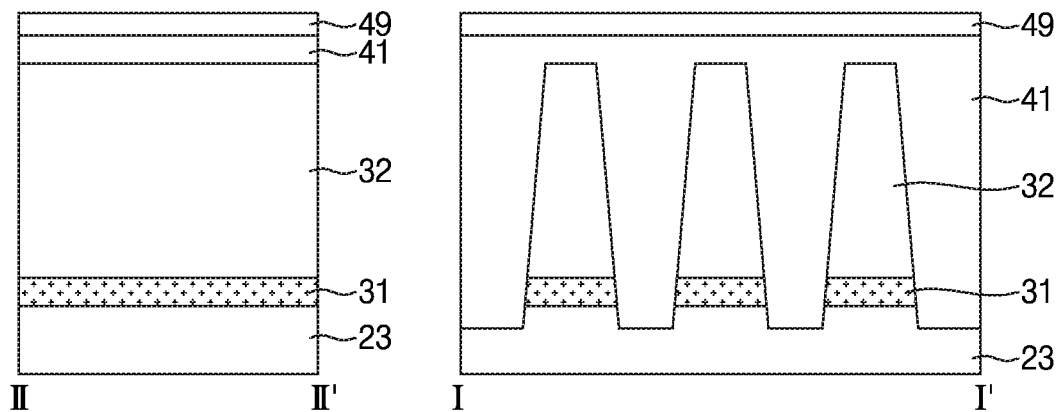

Referring to FIGS. 10 and 16, a second bonding layer 49 may be formed on the device isolation layer 41. The second bonding layer 49 may include, for example, silicon oxide, silicon nitride, silicon oxynitride, or a combination thereof. In some embodiments, the second bonding layer 49 may include, for example, a silicon oxide layer. The second bonding layer 49 may cover the device isolation layer 41. An upper surface of the second bonding layer 49 may be planarized. In some embodiments, the second bonding layer 49 may be omitted.

Figure 17:
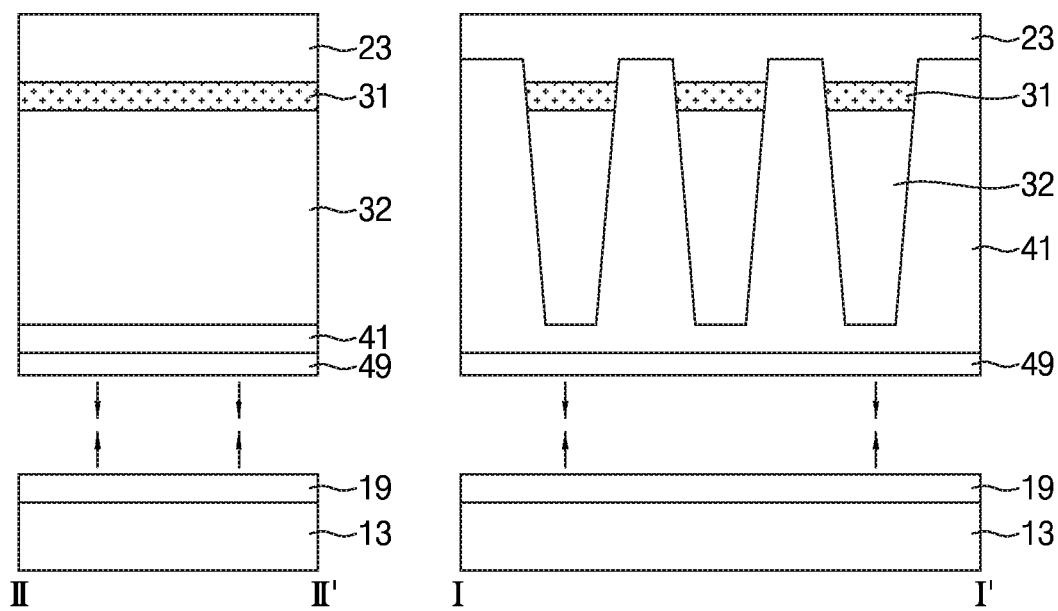
Figure 18:
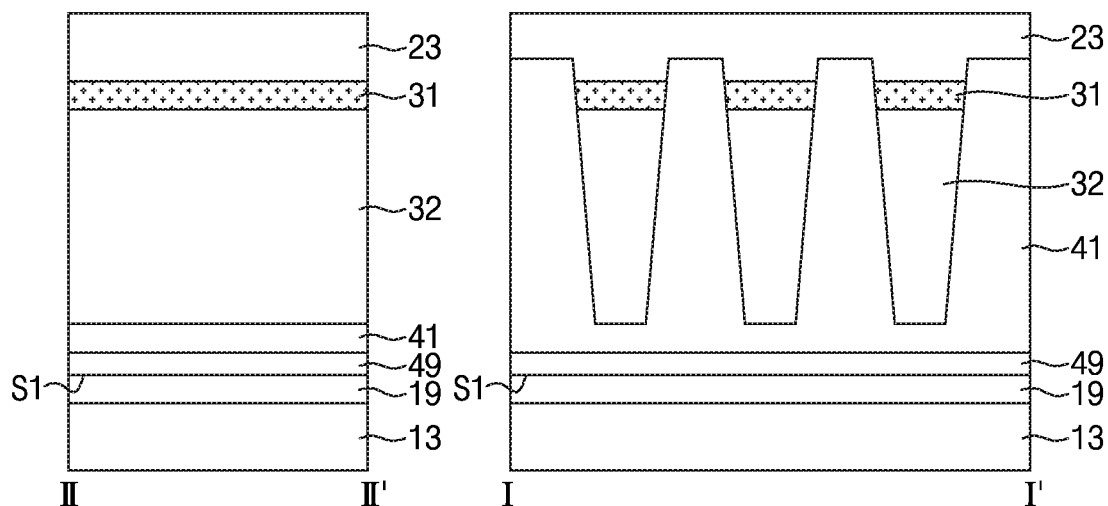

Referring to FIGS. 10, 17, and 18, the second substrate 23 may be bonded onto the first substrate 13. In some embodiments, a flip-bonding process may be applied to the process of bonding the second substrate 23 to the first substrate 13. The second bonding layer 49 may be bonded onto the first bonding layer 19. The second bonding layer 49 may be in contact with the first bonding layer 19. An interface S1 may be formed between the first bonding layer 19 and the second bonding layer 49. In some embodiments, when the second bonding layer 49 is omitted, the first bonding layer 19 may be in contact with the device isolation layer 41.

Figure 19:
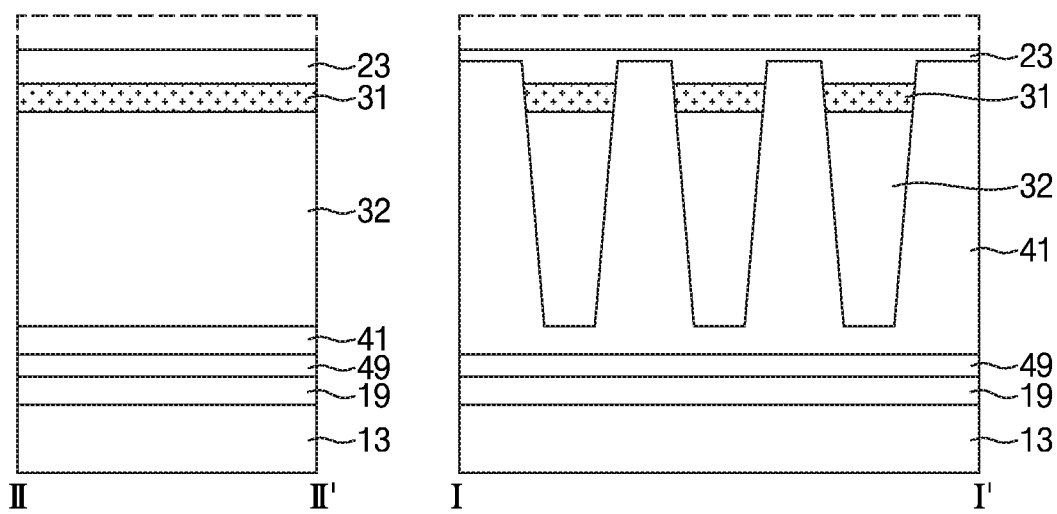

Referring to FIGS. 10 and 19, the second substrate 23 may be partially removed to reduce a thickness of the second substrate 23. The partial removal of the second substrate 23 may include performing, for example, a chemical mechanical polishing (CMP) process, an etchback process, or a combination thereof.

Figure 20:
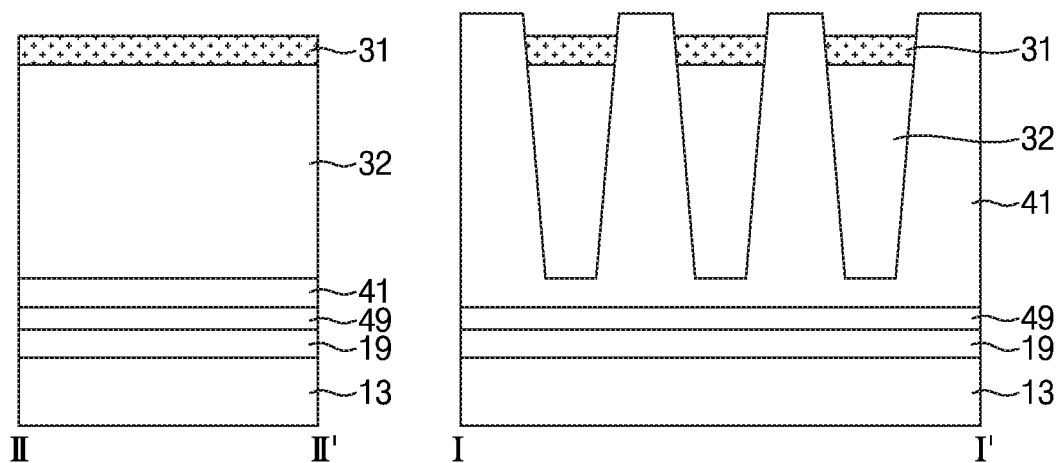

Referring to FIGS. 10 and 20, the second substrate 23 may be completely removed to expose the device isolation layer 41 and the plurality of sacrificial patterns 31. The complete removal of the second substrate 23 may include performing, for example, a CMP process, an isotropic etching process, or a combination thereof. In some embodiments, the second substrate 23 may be removed until the plurality of sacrificial patterns 31 are exposed, and it will be understood that the plurality of sacrificial patterns 31 are used as an etch stopper.

In some embodiments, the complete removal of the second substrate 23 may include performing an isotropic etching process. The second substrate 23 may have an etch selectivity with respect to both the device isolation layer 41 and the plurality of sacrificial patterns 31. The second substrate 23 may exhibit a higher etch rate than the device isolation layer 41 and the plurality of sacrificial patterns 31. The plurality of sacrificial patterns 31 may serve as an etch stop layer during the process of completely removing the second substrate 23. In some embodiments, the second substrate 23 may be etched faster than the device isolation layer 41 and the plurality of sacrificial patterns 31.

Figure 21:
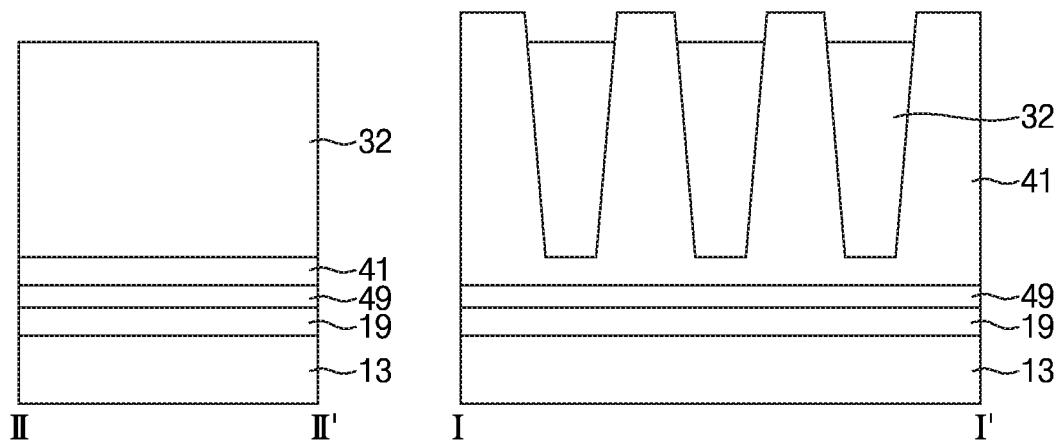

Referring to FIGS. 10 and 21, the plurality of sacrificial patterns 31 may be removed to expose upper surfaces of the plurality of active patterns 32. The removal of the plurality of sacrificial patterns 31 may include performing, for example, a CMP process, an isotropic etching process, or a combination thereof.

In some embodiments, the removal of the plurality of sacrificial patterns 31 may include performing an isotropic etching process. The plurality of sacrificial patterns 31 may have an etch selectivity with respect to both the plurality of active patterns 32 and the device isolation layer 41. The plurality of sacrificial patterns 31 may exhibit a higher etch rate than the plurality of active patterns 32 and the device isolation layer 41. In some embodiments, the plurality of sacrificial patterns 31 may be etched faster than the plurality of active patterns 32 and the device isolation layer 41.

Figure 22:
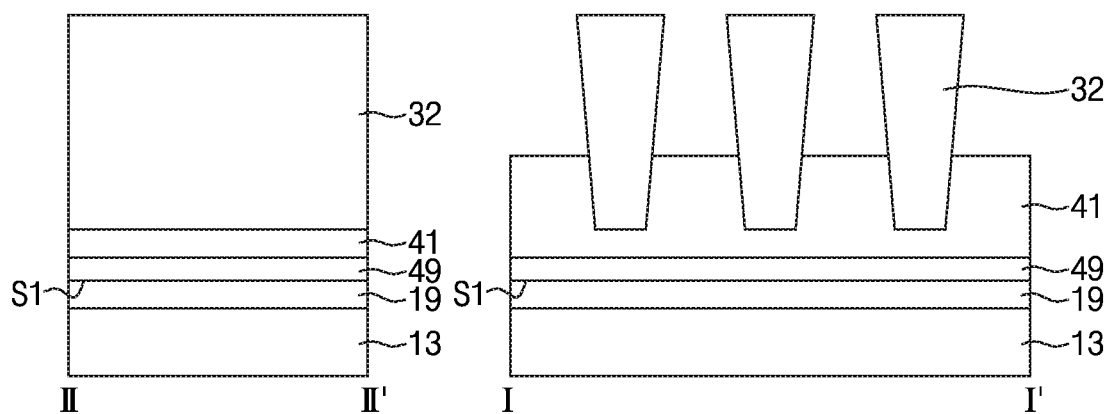

Referring to FIGS. 10 and 22, the device isolation layer 41 may be partially removed to partially expose the side surfaces of the plurality of active patterns 32. Each of the plurality of active patterns 32 may have a width that decreases in a direction toward the interface S 1. An upper surface of the device isolation layer 41 may be formed at a lower level than upper ends of the plurality of active patterns 32. Lower ends of the plurality of active patterns 32 may remain in the device isolation layer 41.

Figure 23:
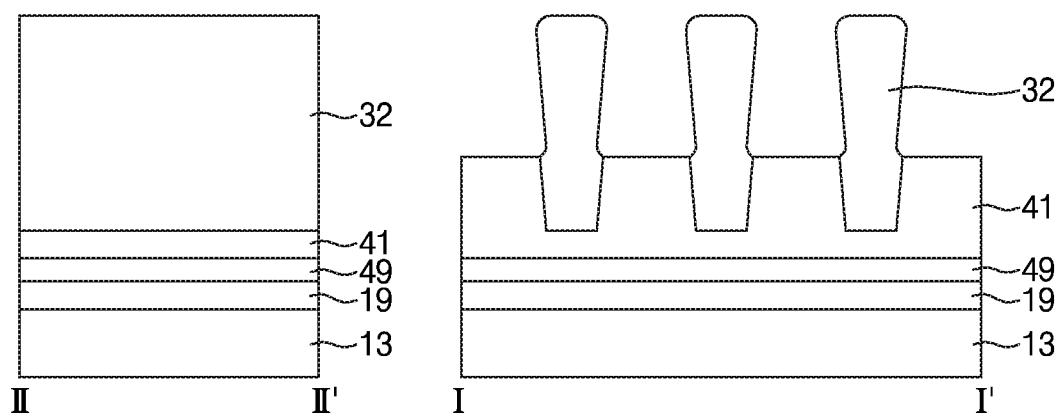

Referring to FIGS. 10 and 23, corners of the plurality of active patterns 32 may be rounded. The rounding of the corners of the plurality of active patterns 32 may include performing, for example, an isotropic etching process, an oxidation process, or a combination thereof.

Figure 24:
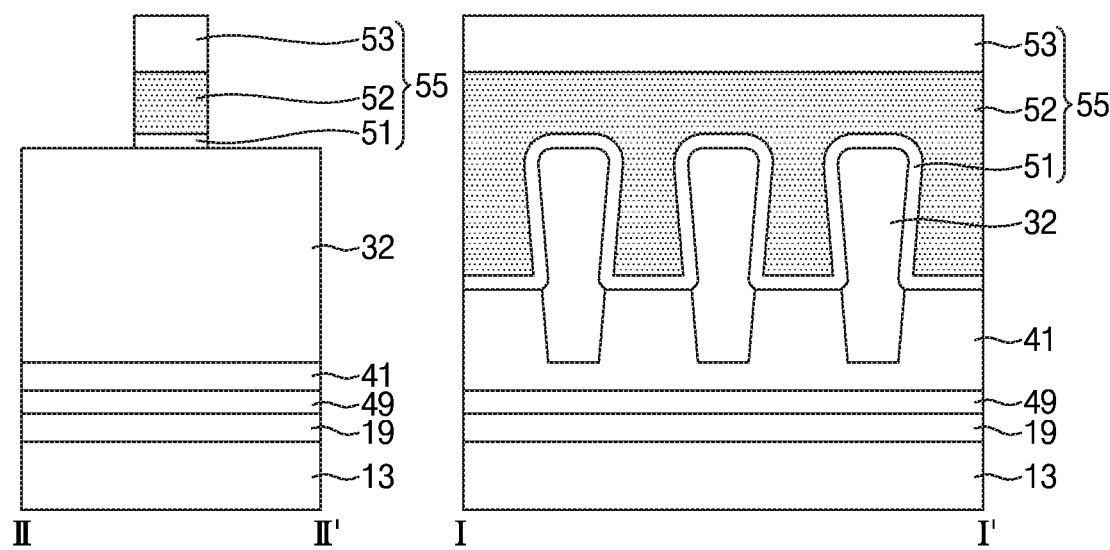

Referring to FIGS. 10 and 24, a preliminary gate structure 55 may be formed to traverse the plurality of active patterns 32. The preliminary gate structure 55 may include a buffer layer 51, a preliminary gate electrode 52, and a mask pattern 53, which are sequentially stacked. The formation of the preliminary gate structure 55 may include performing, for example, a plurality of thin-film forming processes and a plurality of patterning processes.

The buffer layer 51 may be in contact with the upper surfaces and the side surfaces of the plurality of active patterns 32, and the buffer layer 51 may be in contact with the upper surface of the device isolation layer 41. The buffer layer 51 may include, for example, silicon oxide. The preliminary gate electrode 52 may be arranged with the buffer layer 51 on the buffer layer 51. The preliminary gate electrode 52 may include, for example, polysilicon. The mask pattern 53 may be arranged with the preliminary gate electrode 52 on the preliminary gate electrode 52. The mask pattern 53 may include, for example, silicon nitride.

Figure 25:
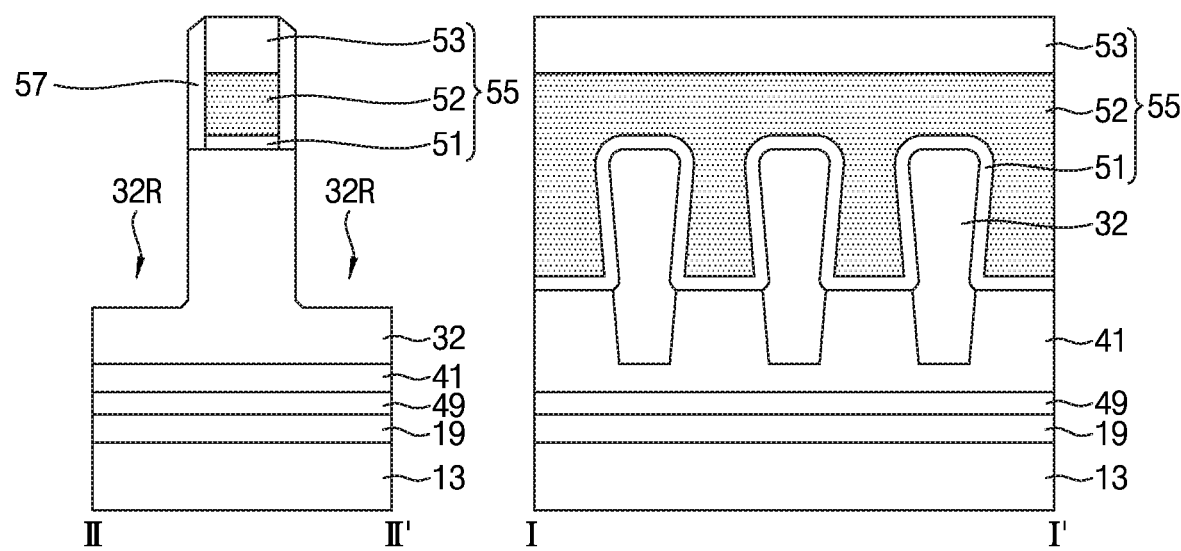

Referring to FIGS. 10 and 25, gate spacers 57 may be formed on side surfaces of the preliminary gate structure 55. The plurality of active patterns 32, which are adjacent to both sides of the preliminary gate structure 55, may be partially removed to form a plurality of recess regions 32R. The gate spacers 57 may include a single layer or a multi-layered structure. The gate spacers 57 may include, for example, silicon oxide, silicon nitride, silicon oxynitride, or a combination thereof. The formation of the plurality of recess regions 32R may include performing, for example, an anisotropic etching process using the mask pattern 53 and the gate spacers 57 as an etch mask. The plurality of active patterns 32 may be exposed at side surfaces and bottom surfaces of the plurality of recess regions 32R.

Figure 26:
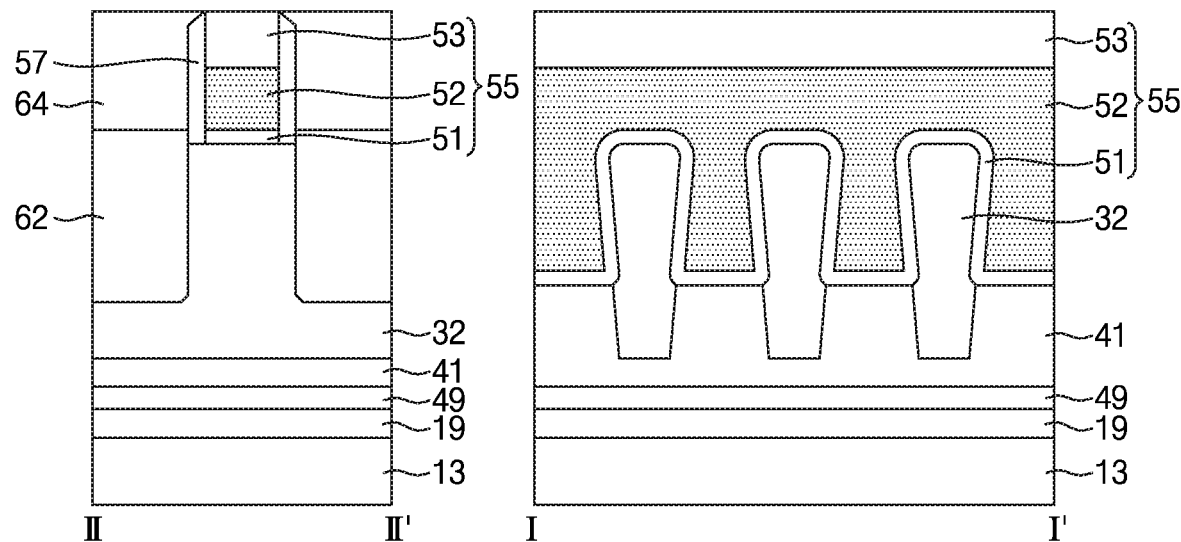

Referring to FIGS. 10 and 26, a plurality of source/drain regions 62 may be formed in the plurality of recess regions 32R, respectively. Uppermost ends of the plurality of source/drain regions 62 may be formed at a higher level than uppermost ends of the plurality of active patterns 32. An interlayer insulating layer 64 may be formed on the plurality of source/drain regions 62.

The plurality of source/drain regions 62 may be formed using a second epitaxial growth process. The plurality of source/drain regions 62 may each include, for example, a SiGe layer, a SiC layer, a Si layer, or a combination thereof. The plurality of source/drain regions 62 may include N-type or P-type impurities. The plurality of source/drain regions 62 may include impurities of a different conductivity type from the plurality of active patterns 32.

In some embodiments, the plurality of active patterns 32 may include, for example, phosphorus (P), arsenic (As), or a combination thereof, and the plurality of source/drain regions 62 may include, for example, a boron (B)-doped silicon germanium (SiGe) layer. In some embodiments, the plurality of active patterns 32 may include, for example, boron (B), and the plurality of source/drain regions 62 may each include, for example, a phosphorus (P)-doped silicon carbide (SiC) layer, an arsenic (As)-doped SiC layer, a P-doped silicon (Si) layer, an As-doped Si layer, or a combination thereof.

The interlayer insulating layer 64 may cover the plurality of source/drain regions 62. The interlayer insulating layer 64 may include, for example, silicon oxide, silicon nitride, silicon oxynitride, a low-k dielectric, or a combination thereof. Upper surfaces of the interlayer insulating layer 64, the gate spacers 57, and the preliminary gate structure 55 may be coplanar with each other.

Figure 27:
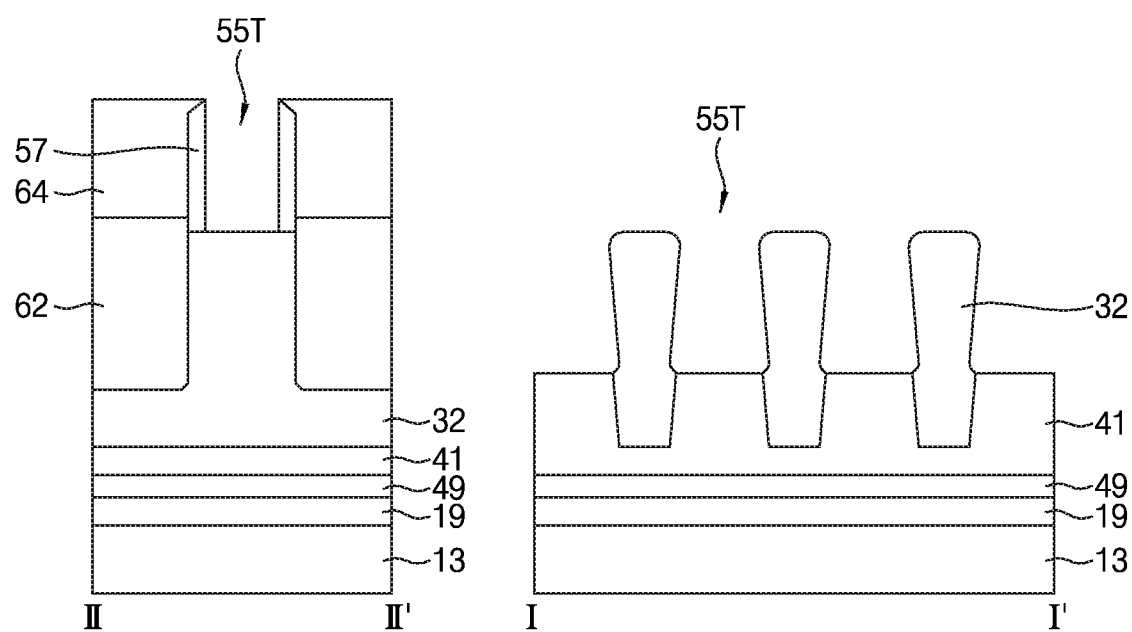

Referring to FIGS. 10 and 27, the preliminary gate structure 55 may be removed to form a gate trench 55T. The gate trench 55T may expose the upper surfaces and the side surfaces of the plurality of active patterns 32. The gate trench 55T may expose the upper surface of the device isolation layer 41.

Figure 28:
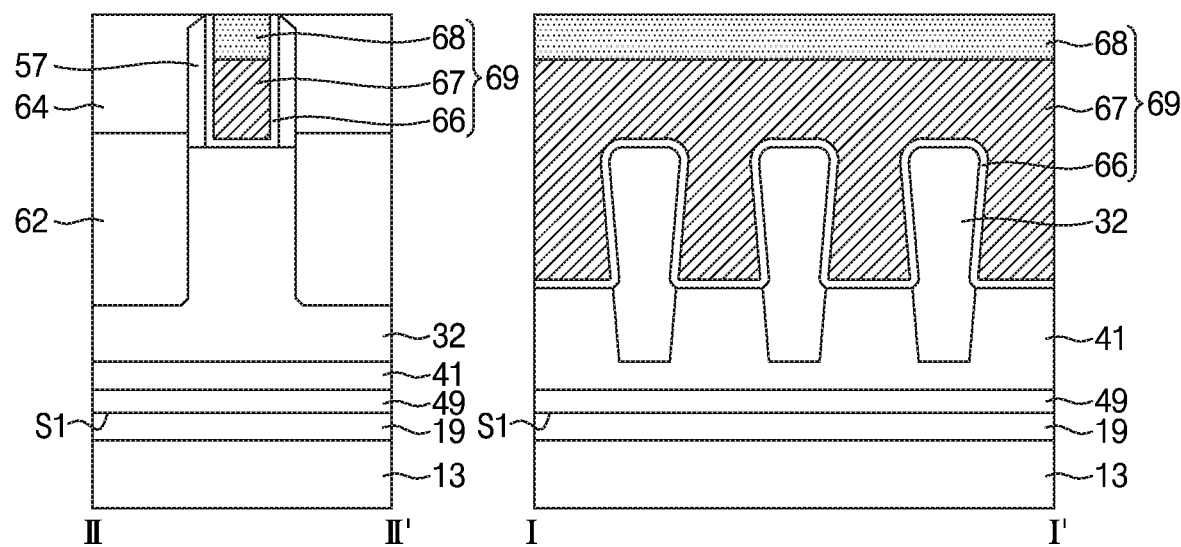

Referring to FIGS. 10 and 28, a gate structure 69 may be formed in the gate trench 55T. The gate structure 69 may include a gate dielectric layer 66, a gate electrode 67, and a capping layer 68, which are sequentially stacked.

The gate dielectric layer 66 may be in direct contact with the upper surfaces and the side surfaces of the plurality of active patterns 32. The gate dielectric layer 66 may include a single layer or a multilayered structure. The gate dielectric layer 66 may include, for example, silicon oxide, silicon nitride, silicon oxynitride, a high-k dielectric, or a combination thereof. The gate electrode 67 may be formed on the gate dielectric layer 66. The gate electrode 67 may include a conductive material such as a metal, a metal nitride, a metal oxide, a metal silicide, a conductive carbon, polysilicon, or a combination thereof. The capping layer 68 may be formed on the gate electrode 67. The capping layer 68 may include, for example, silicon nitride.

In some embodiments, the gate dielectric layer 66 may be formed between the plurality of active patterns 32 and the gate electrode 67 and between the gate electrode 67 and the gate spacers 57. The gate dielectric layer 66 may extend between the capping layer 68 and the gate spacers 57. The upper surfaces of the interlayer insulating layer 64 and the gate spacers 57 and upper surfaces of the gate dielectric layer 66 and the capping layer 68 may be coplanar with each other.

In some embodiments, the gate structure 69 may traverse the plurality of active patterns 32. The gate electrode 67 may traverse the plurality of active patterns 32. The gate electrode 67 may be formed on the upper surfaces and the side surfaces of the plurality of active patterns 32. The plurality of source/drain regions 62 may be formed adjacent to opposing sides of the gate electrode 67, respectively. Upper ends of the plurality of source/drain regions 62 may protrude at a higher level than upper ends of the plurality of active patterns 32.

Figure 29:
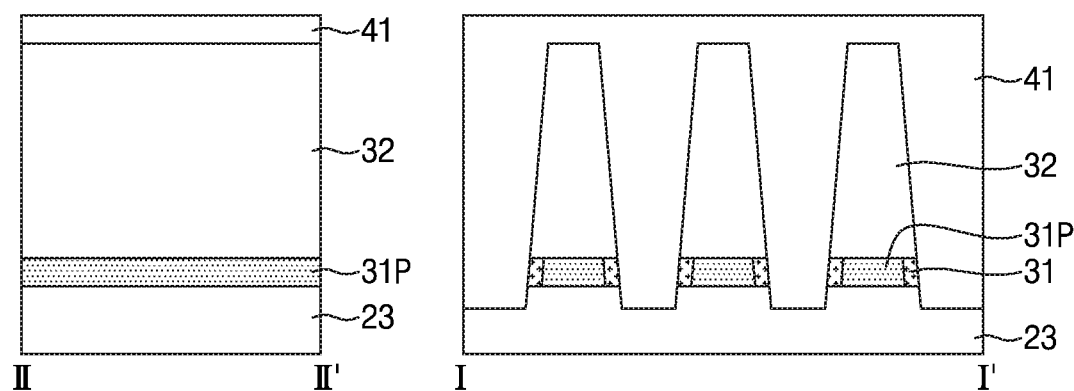
Figure 30:
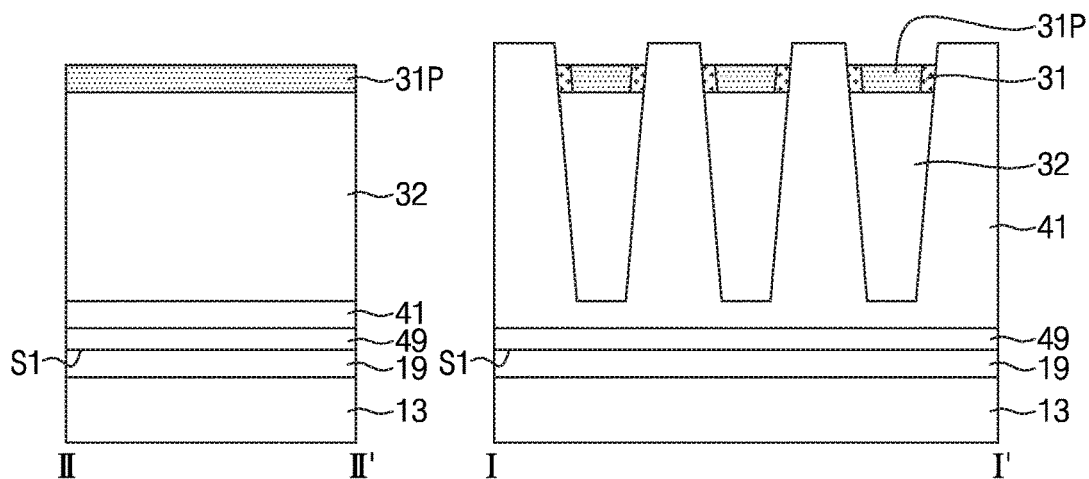

FIGS. 29 and 30 are cross-sectional views taken along the lines I-I' and II-II' of FIG. 10 that illustrate a method of forming a semiconductor device according to some example embodiments of the inventive concept.

Referring to FIG. 29, a plurality of preliminary sacrificial patterns 31P may be oxidized to form a plurality of sacrificial patterns 31. The plurality of sacrificial patterns 31 may be formed along edges of the plurality of preliminary sacrificial patterns 31P. The plurality of sacrificial patterns 31 may be formed along interfaces between a device isolation layer 41 and the plurality of preliminary sacrificial patterns 31P. The plurality of sacrificial patterns 31 may be formed between the device isolation layer 41 and the plurality of preliminary sacrificial patterns 31P. The plurality of preliminary sacrificial patterns 31P (i.e., portions of the plurality of preliminary sacrificial patterns 31P) may remain between the plurality of sacrificial patterns 31.

Referring to FIG. 30, a second bonding layer 49 may be formed on the device isolation layer 41. The second bonding layer 49 may be bonded onto a first bonding layer 19. A second substrate 23 may be removed to expose the device isolation layer 41, the plurality of sacrificial patterns 31, and the plurality of preliminary sacrificial patterns 31P.

FIGS. 31 to 35 are cross-sectional views taken along the lines I-I' and II-II' of FIG. 10 that illustrate a method of forming a semiconductor device according to some example embodiments of the inventive concept.

Figure 31:
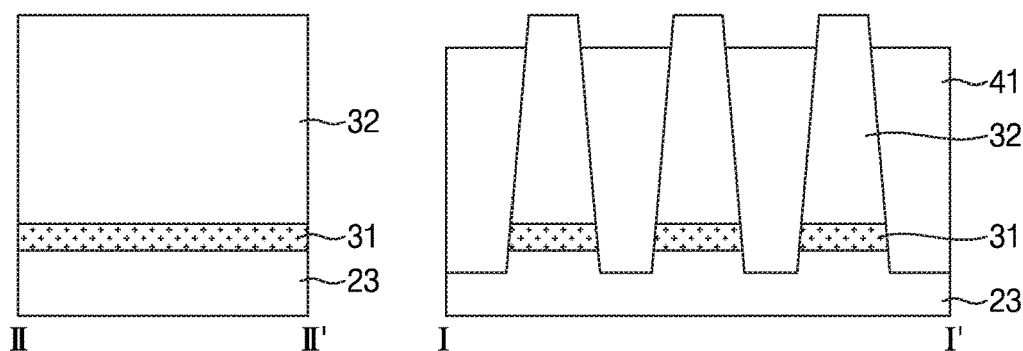

Referring to FIG. 31, a plurality of sacrificial patterns 31, a plurality of active patterns 32, and a device isolation layer 41 may be formed on a second substrate 23 using a method similar to that described with reference to FIGS. 12 to 15. The device isolation layer 41 may be partially removed to expose ends of the plurality of active patterns 32.

Figure 32:
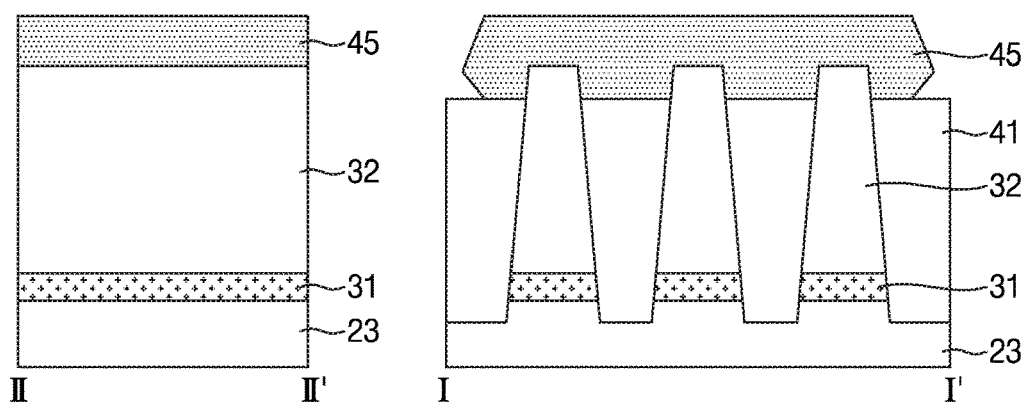

Referring to FIG. 32, a stressor 45 may be formed on the plurality of active patterns 32. The stressor 45 may be formed using a third epitaxial growth process. The stressor 45 may include, for example, a SiGe layer, a SiC layer, a Si layer, or a combination thereof. The stressor 45 may cover upper surfaces and side surfaces of the plurality of active patterns 32. In some embodiments, the third epitaxial growth process may be referred to as a second epitaxial growth process. In some embodiments, the stressor 45 may be formed by performing an epitaxial growth process using the plurality of active patterns 32 as a seed layer.

In some embodiments, the plurality of active patterns 32 may include, for example, phosphorus (P), arsenic (As), or a combination thereof, and the stressor 45 may, for example, include a SiGe layer. In some embodiments, the plurality of active patterns 32 may include, for example, boron (B), and the stressor 45 may include, for example, a SiC layer, a Si layer, or a combination thereof.

Figure 33:
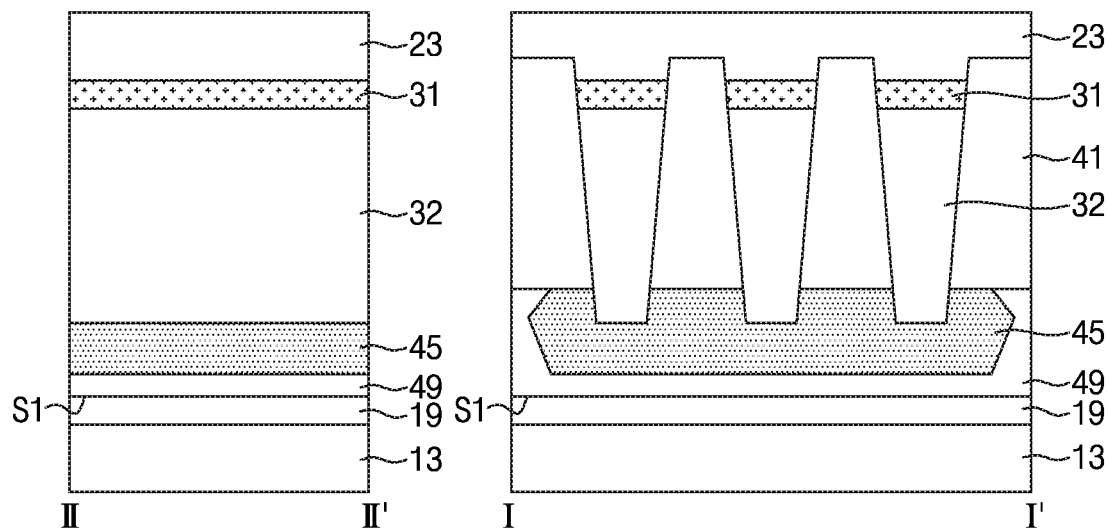

Referring to FIG. 33, a second bonding layer 49 may be formed on the stressor 45. The second substrate 23 may be bonded onto a first substrate 13. The second bonding layer 49 may be bonded onto a first bonding layer 19.

Figure 34:
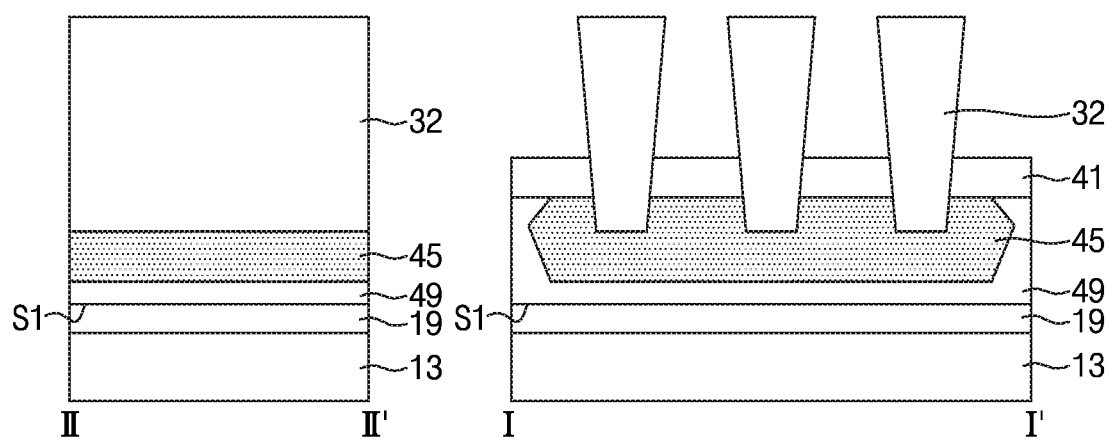

Referring to FIG. 34, the second substrate 23 and the plurality of sacrificial patterns 31 may be sequentially removed, and the device isolation layer 41 may be partially removed, thereby exposing the upper surfaces and the side surfaces of the plurality of active patterns 32.

Figure 35:
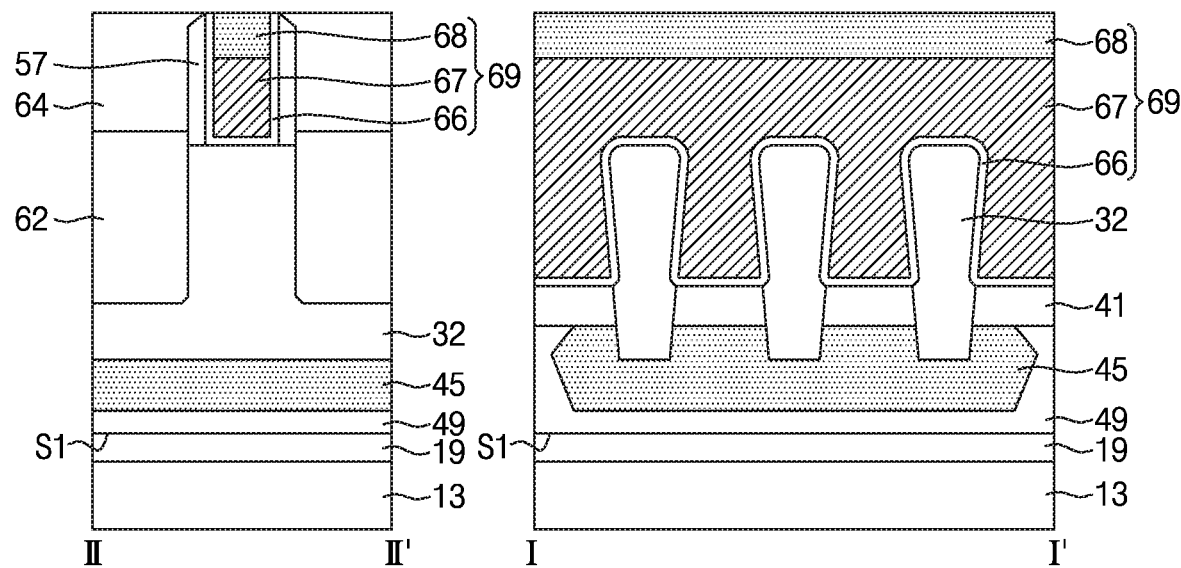

Referring to FIG. 35, gate spacers 57, a plurality of source/drain regions 62, an interlayer insulating layer 64, and a gate structure 69 may be formed using a method similar to that described with reference to FIGS. 23 to 28.

In some embodiments, the stressor 45 may be formed between a gate electrode 67 and the second bonding layer 49 and between the plurality of source/drain regions 62 and the second bonding layer 49.

FIGS. 36 to 39 are cross-sectional views taken along the lines I-I' and II-II' of FIG. 10 that illustrate a method of forming a semiconductor device according to some example embodiments of the inventive concept.

Figure 36:
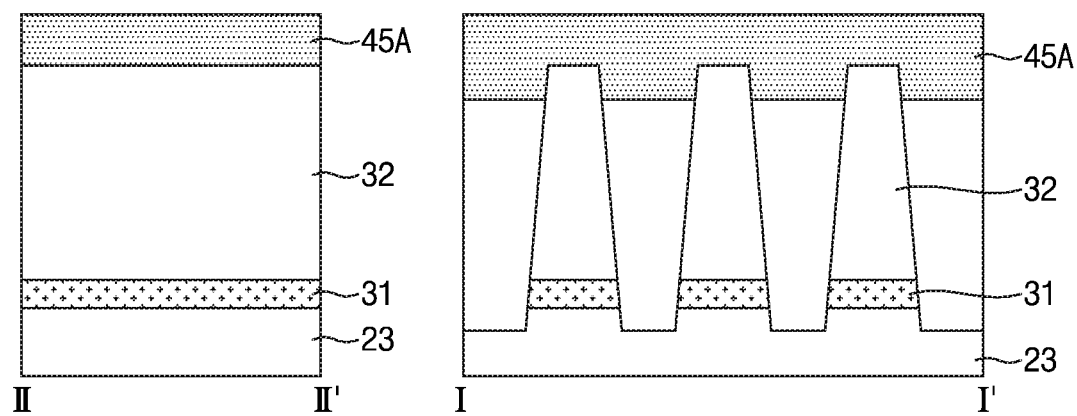

Referring to FIG. 36, an upper surface of a device isolation layer 41 may be formed at a lower level than the upper ends of a plurality of active patterns 32. A stressor 45A may be formed on the plurality of active patterns 32. The stressor 45A may be formed using a thin-film deposition process. The stressor 45A may include, for example, a silicon nitride layer, a silicon oxynitride layer, or a combination thereof. The stressor 45A may cover upper surfaces and side surfaces of the plurality of active patterns 32.

In some embodiments, the plurality of active patterns 32 may include, for example, phosphorus (P), arsenic (As), or a combination thereof, and the stressor 45A may include, for example, a silicon nitride layer. In some embodiments, the plurality of active patterns 32 may include, for example, boron (B), and the stressor 45A may include, for example, a silicon oxynitride layer.

Figure 37:
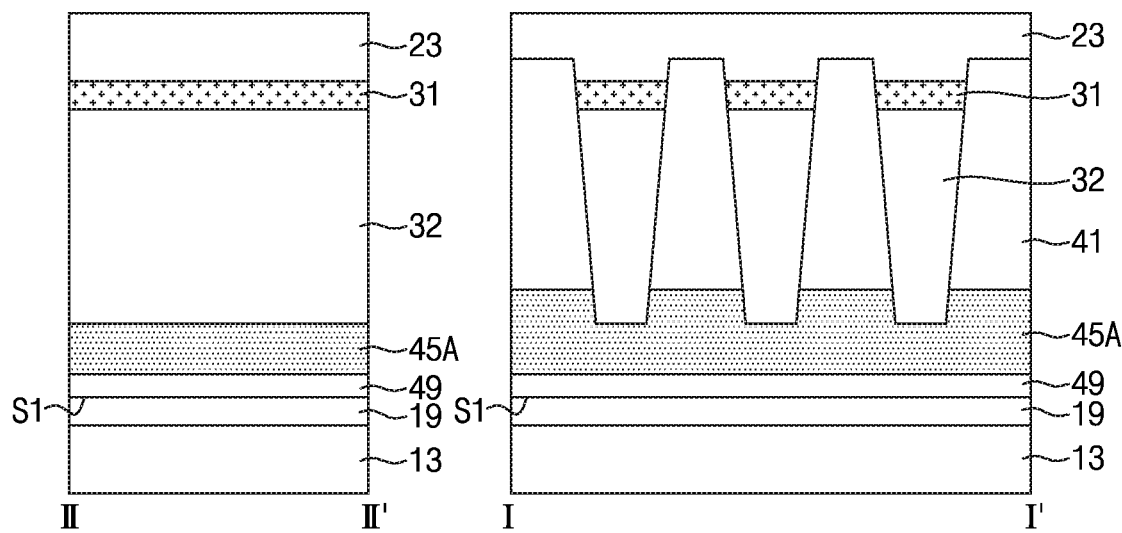

Referring to FIG. 37, a second bonding layer 49 may be formed on the stressor 45A. The second substrate 23 may be bonded onto a first substrate 13. The second bonding layer 49 may be in contact with the first bonding layer 19.

Figure 38:
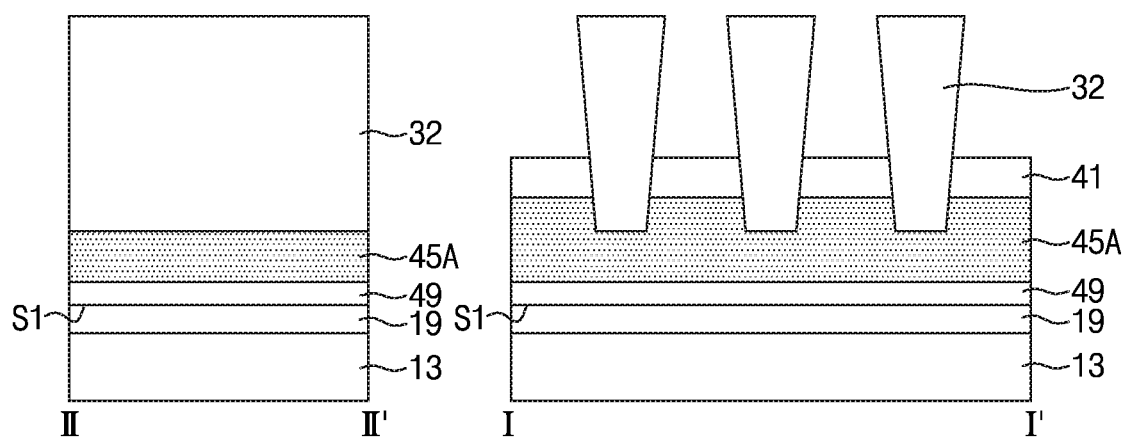

Referring to FIG. 38, the second substrate 23 and a plurality of sacrificial patterns 31 may be sequentially removed, and the device isolation layer 41 may be partially removed, thereby exposing the upper surfaces and the side surfaces of the plurality of active patterns 32.

Figure 39:
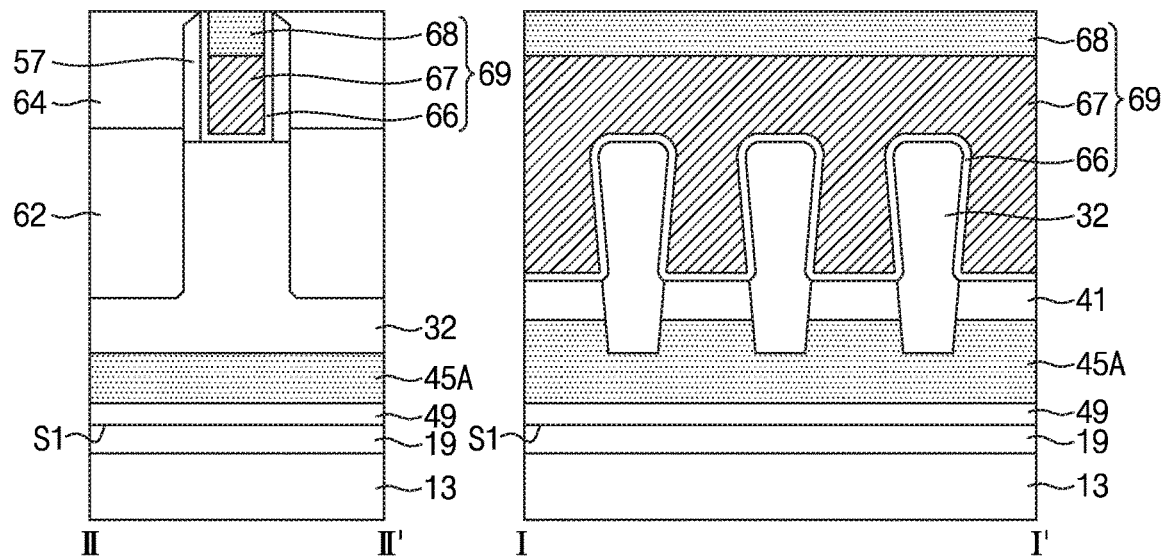

Referring to FIG. 39, gate spacers 57, a plurality of source/drain regions 62, an interlayer insulating layer 64, and a gate structure 69 may be formed using a method similar to that described with reference to FIGS. 23 to 28.

FIGS. 40 to 48 are cross-sectional views illustrating a method of forming a semiconductor device according to some example embodiments of the inventive concept.

Figure 40:
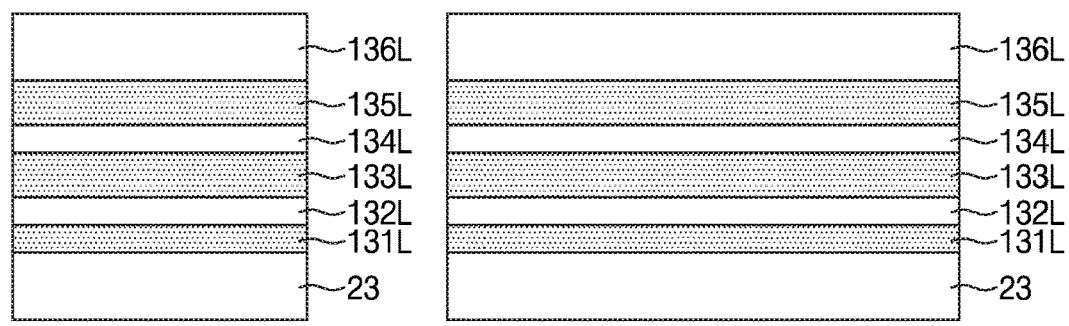
FIGS. 40 to 52 are cross-sectional views illustrating a method of forming a semiconductor device according to example embodiments of the inventive concept.

Referring to FIG. 40, a plurality of sacrificial layers 131L, 133L, and 135L and a plurality of active layers 132L, 134L, and 136L may be alternately and repeatedly formed on a second substrate 23. The plurality of sacrificial layers 131L, 133L, and 135L and the plurality of active layers 132L, 134L, and 136L may be formed using a first epitaxial growth process. In some embodiments, each of the plurality of sacrificial layers 131L, 133L, and 135L may include, for example, a SiGe layer, and each of the plurality of active layers 132L, 134L, and 136L may include, for example, a Si layer.

Figure 41:
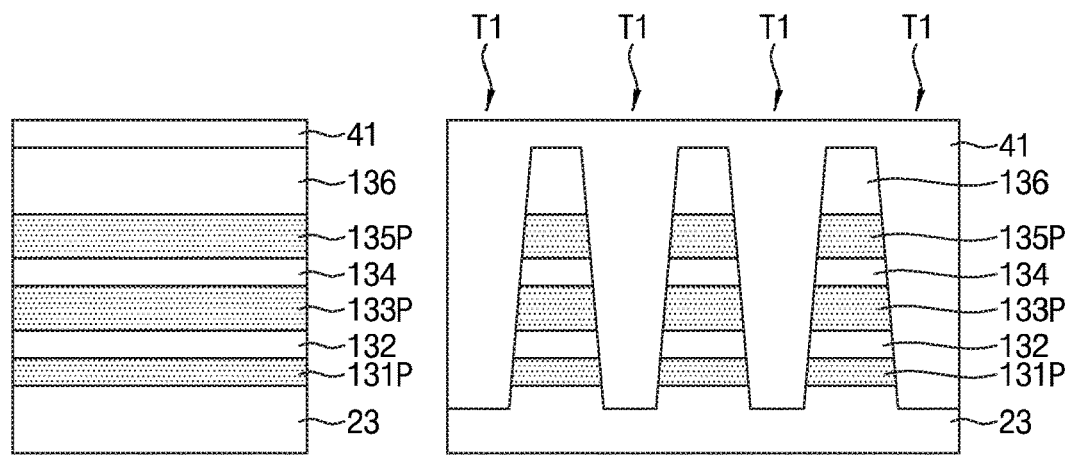

Referring to FIG. 41, the plurality of active layers 132L, 134L, and 136L and the plurality of sacrificial layers 131L, 133L, and 135L may be patterned, thereby forming a plurality of trenches T1 that define a plurality of active patterns 132, 134, and 136 and a plurality of preliminary sacrificial patterns 131P, 133P, and 135P. A device isolation layer 41 may be formed in (e.g., formed to fill) the plurality of trenches T1 and cover the plurality of active patterns 132, 134, and 136 and the plurality of preliminary sacrificial patterns 131P, 133P, and 135P. The device isolation layer 41 may be in direct contact with side surfaces of the plurality of active patterns 132, 134, and 136 and side surfaces of the plurality of preliminary sacrificial patterns 131P, 133P, and 135P. The plurality of active patterns 132, 134, and 136 may include a plurality of first active patterns 132, a plurality of second active patterns 134, and a plurality of third active patterns 136. It will be understood that "an element A fills an element B" (or similar language) as used herein means that the element A is in the element B but does not necessarily mean that the element A fills the element B entirely.

Figure 42:
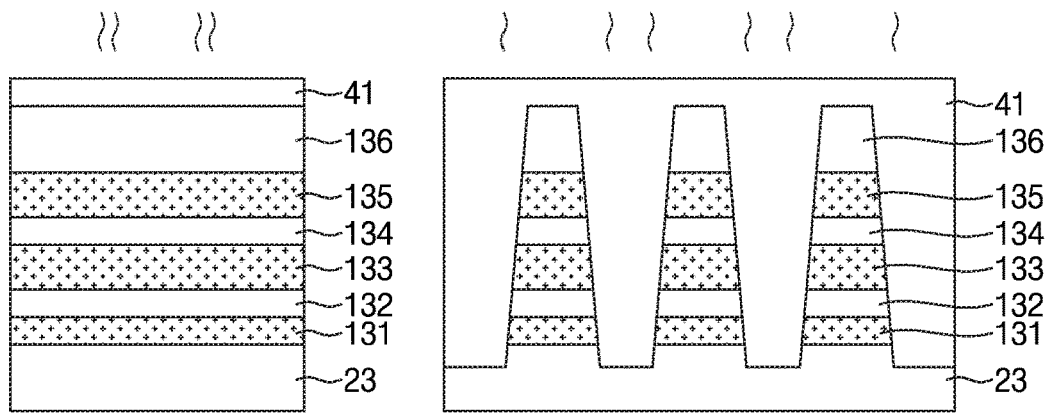

Referring to FIG. 42, the plurality of preliminary sacrificial patterns 131P, 133P, and 135P may be oxidized to form a plurality of sacrificial patterns 131, 133, and 135. The plurality of sacrificial patterns 131, 133, and 135 may include a plurality of first sacrificial patterns 131, a plurality of second sacrificial patterns 133, and a plurality of third sacrificial patterns 135. In some embodiments, each of the plurality of sacrificial patterns 131, 133, and 135 may include, for example, a SiGeO layer. Each of the plurality of active patterns 132, 134, and 136 may include, for example, a Si layer. In some embodiments, the plurality of sacrificial patterns 131, 133, and 135 and the plurality of active patterns 132, 134, and 136 may be alternately stacked on the second substrate 23.

Figure 43:
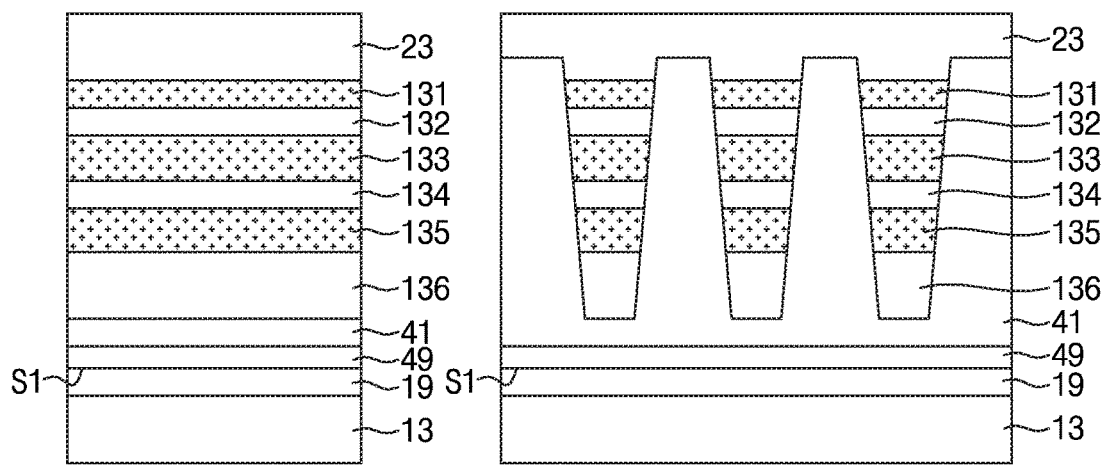

Referring to FIG. 43, a second bonding layer 49 may be formed on the device isolation layer 41. The second substrate 23 may be bonded onto a first substrate 13. The second bonding layer 49 may be bonded onto a first bonding layer 19. The second bonding layer 49 may be in contact with the first bonding layer 19. An interface S1 may be formed between the first bonding layer 19 and the second bonding layer 49.

Figure 44:
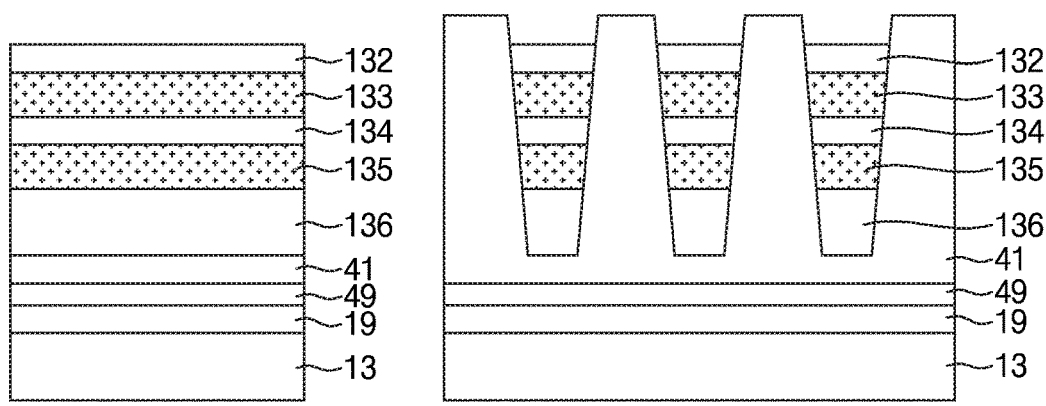

Referring to FIG. 44, the second substrate 23 and the plurality of first sacrificial patterns 131 may be sequentially removed to expose the plurality of first active patterns 132.

Figure 45:
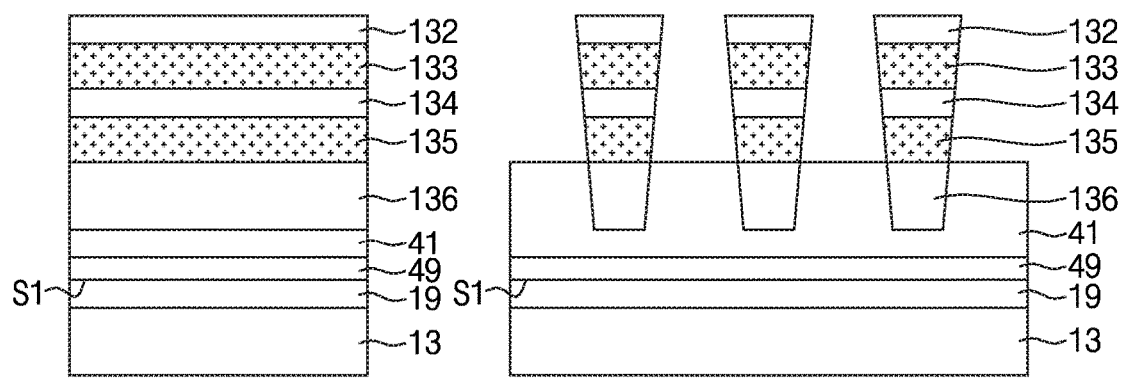

Referring to FIG. 45, the device isolation layer 41 may be partially removed to expose the plurality of first active patterns 132, the plurality of second sacrificial patterns 133, the plurality of second active patterns 134, and the plurality of third sacrificial patterns 135. An upper surface of the device isolation layer 41 may be formed at a level adjacent to interfaces between the plurality of third sacrificial patterns 135 and the plurality of third active patterns 136. The plurality of third active patterns 136 may remain in the device isolation layer 41. In some embodiments, the upper surface of the device isolation layer 41 may be coplanar with the interfaces between the plurality of third sacrificial patterns 135 and the plurality of third active patterns 136 as illustrated in FIG. 45.

Figure 46:
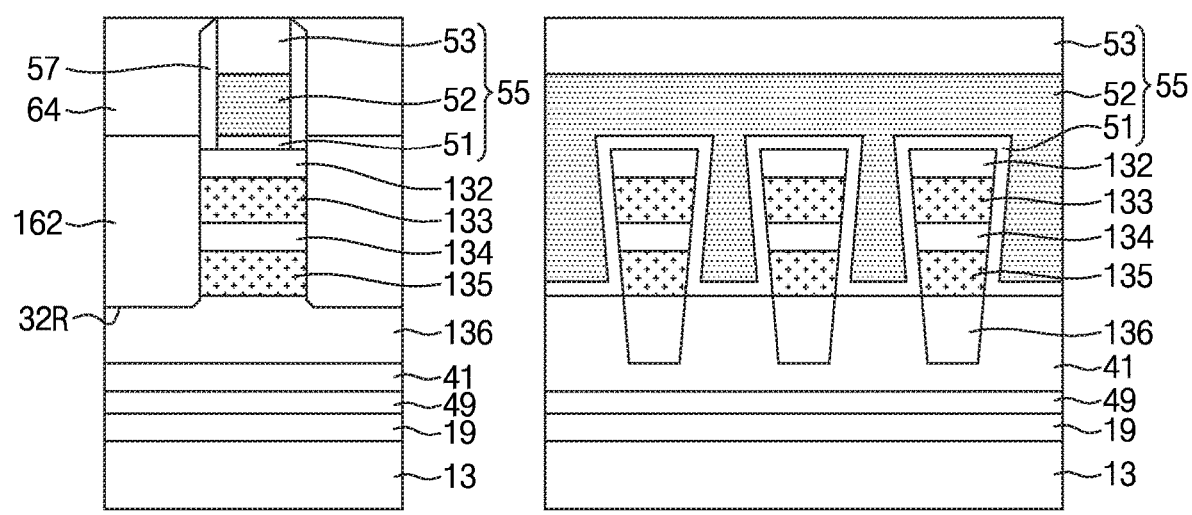

Referring to FIG. 46, a preliminary gate structure 55, gate spacers 57, a plurality of source/drain regions 162, and an interlayer insulating layer 64 may be formed using a method similar to that described with reference to FIGS. 24 to 26. The preliminary gate structure 55 may include a buffer layer 51, a preliminary gate electrode 52, and a mask pattern 53.

In some embodiments, the plurality of first active patterns 132, the plurality of second sacrificial patterns 133, the plurality of second active patterns 134, the plurality of third sacrificial patterns 135, and the plurality of third active patterns 136, which are adjacent to both sides of the preliminary gate structure 55, may be partially removed to form a plurality of recess regions 32R. The plurality of source/drain regions 162 may be formed in the plurality of recess regions 32R, respectively. The interlayer insulating layer 64 may be formed on the plurality of source/drain regions 162.

Figure 47:
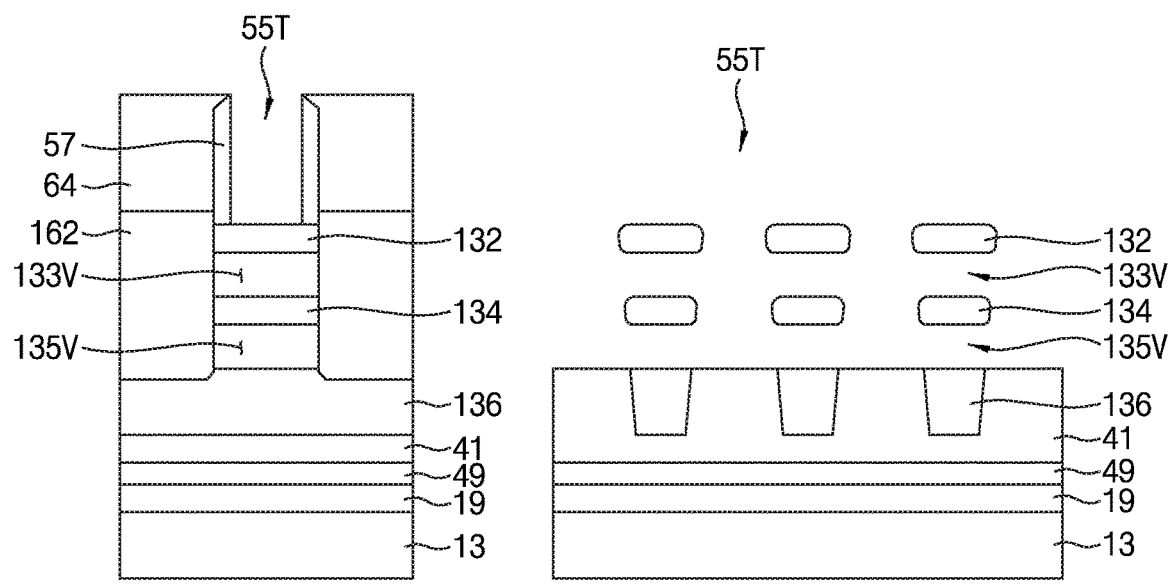

Referring to FIG. 47, the preliminary gate structures 55 may be removed to form a gate trench 55T. The plurality of second sacrificial patterns 133 and the plurality of third sacrificial patterns 135 may be removed to form a plurality of vacant spaces 133V and 135V. The plurality of vacant spaces 133V and 135V may communicate with the gate trench 55T. In some embodiments, the plurality of vacant spaces 133V and 135V and the gate trench 55T may be connected to each other as illustrated in FIG. 47.

Figure 48:
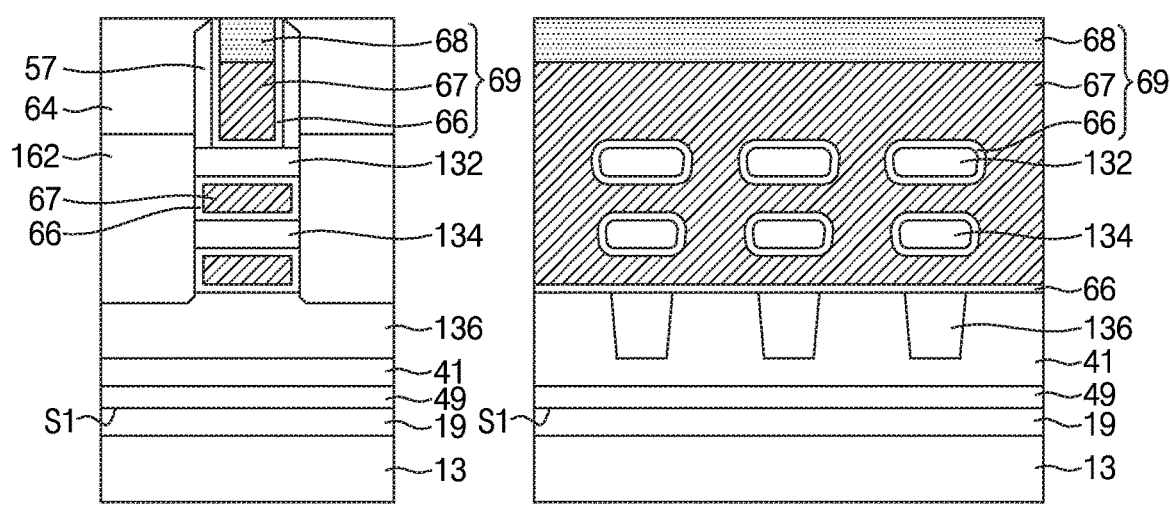

Referring to FIG. 48, a gate structure 69 may be formed in the gate trench 55T and the plurality of vacant spaces 133V and 135V. The gate structure 69 may include a gate dielectric layer 66, a gate electrode 67, and a capping layer 68. In some embodiments, the gate electrode 67 may be formed to traverse the plurality of active patterns 132, 134, and 136. The gate electrode 67 may extend between the plurality of active patterns 132, 134, and 136. The plurality of source/drain regions 162 may be in direct contact with side surfaces of the plurality of first active patterns 132 and side surfaces of the plurality of second active patterns 134.

Figure 49:
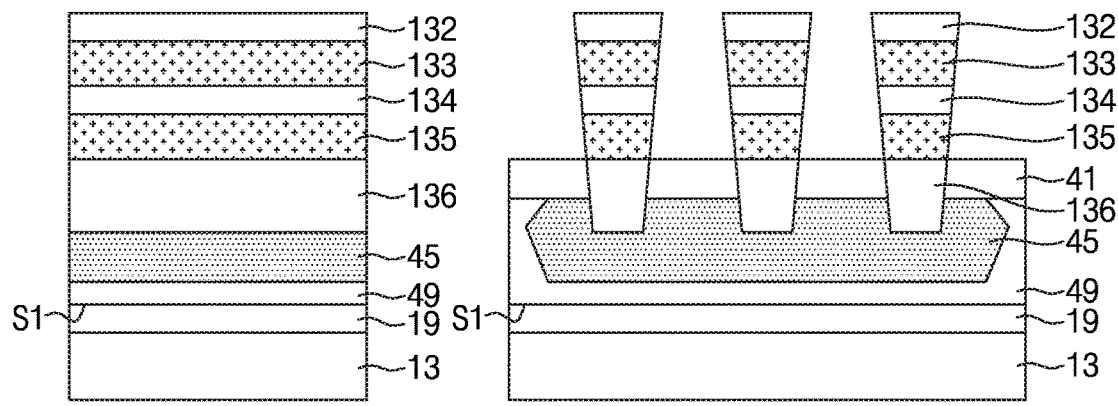
Figure 50:
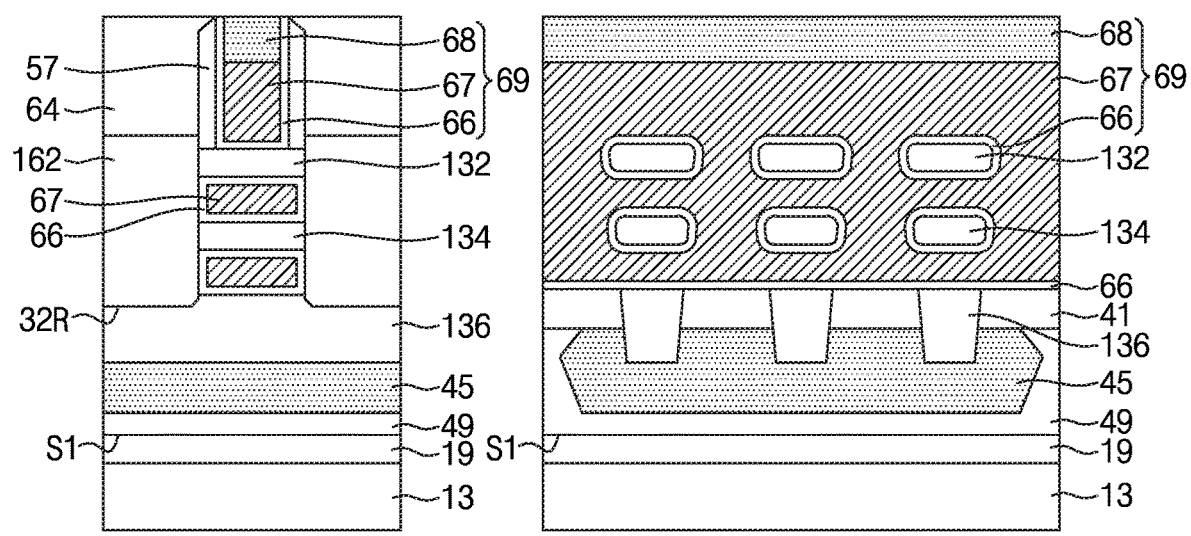

FIGS. 49 and 50 are cross-sectional views illustrating a method of forming a semiconductor device according to some example embodiments of the inventive concept.

Referring to FIG. 49, a first bonding layer 19, a second bonding layer 49, a stressor 45, a device isolation layer 41, a plurality of first active patterns 132, a plurality of second sacrificial patterns 133, a plurality of second active patterns 134, a plurality of third sacrificial patterns 135, and a plurality of third active patterns 136 may be formed on a first substrate 13. In some embodiments, the stressor 45 may be formed between the plurality of third active patterns 136 and the second bonding layer 49 and between the device isolation layer 41 and the second bonding layer 49.

Referring to FIG. 50, gate spacers 57, a plurality of source/drain regions 162, an interlayer insulating layer 64, and a gate structure 69 may be formed using a method similar to that described with reference to FIGS. 46 to 48. The plurality of source/drain regions 162 may be disposed adjacent to opposing sides of a gate electrode 67, respectively. The stressor 45 may be disposed between the gate electrode 67 and the second bonding layer 49 and between the plurality of source/drain regions 162 and the second bonding layer 49. The plurality of source/drain regions 162 may be in direct contact with side surfaces of the plurality of first active patterns 132 and the plurality of second active patterns 134.

Figure 51:
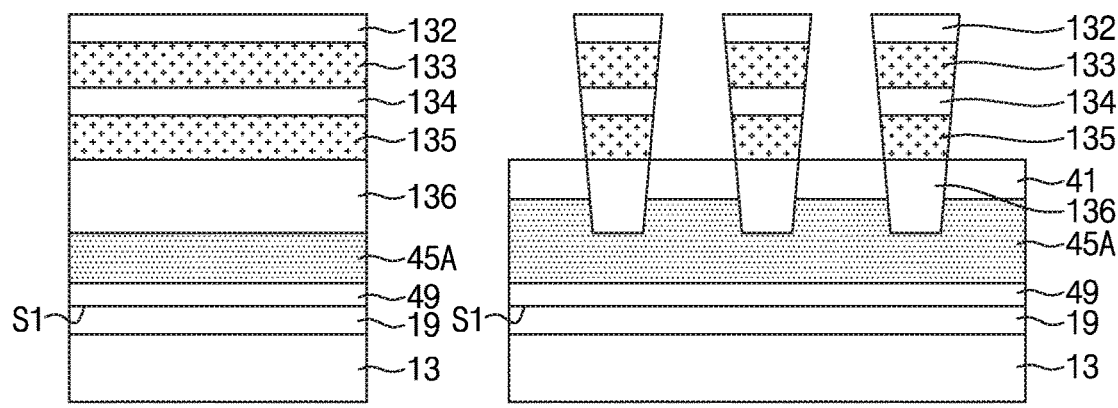
Figure 52:
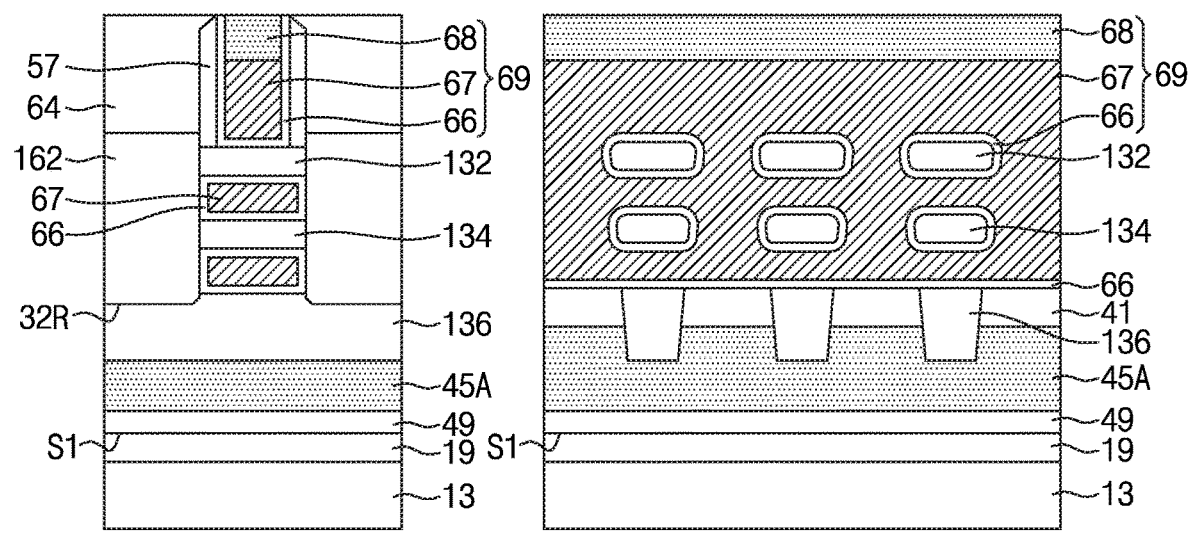

FIGS. 51 and 52 are cross-sectional views illustrating a method of forming a semiconductor device according to some example embodiments of the inventive concept.

Referring to FIG. 51, a first bonding layer 19, a second bonding layer 49, a stressor 45A, a device isolation layer 41, a plurality of first active patterns 132, a plurality of second sacrificial patterns 133, a plurality of second active patterns 134, a plurality of third sacrificial patterns 135, and a plurality of third active patterns 136 may be formed on a first substrate 13.

Referring to FIG. 52, gate spacers 57, a plurality of source/drain regions 162, an interlayer insulating layer 64, and a gate structure 69 may be formed using a method similar to that described with reference to FIGS. 46 to 48.

Figure 53:
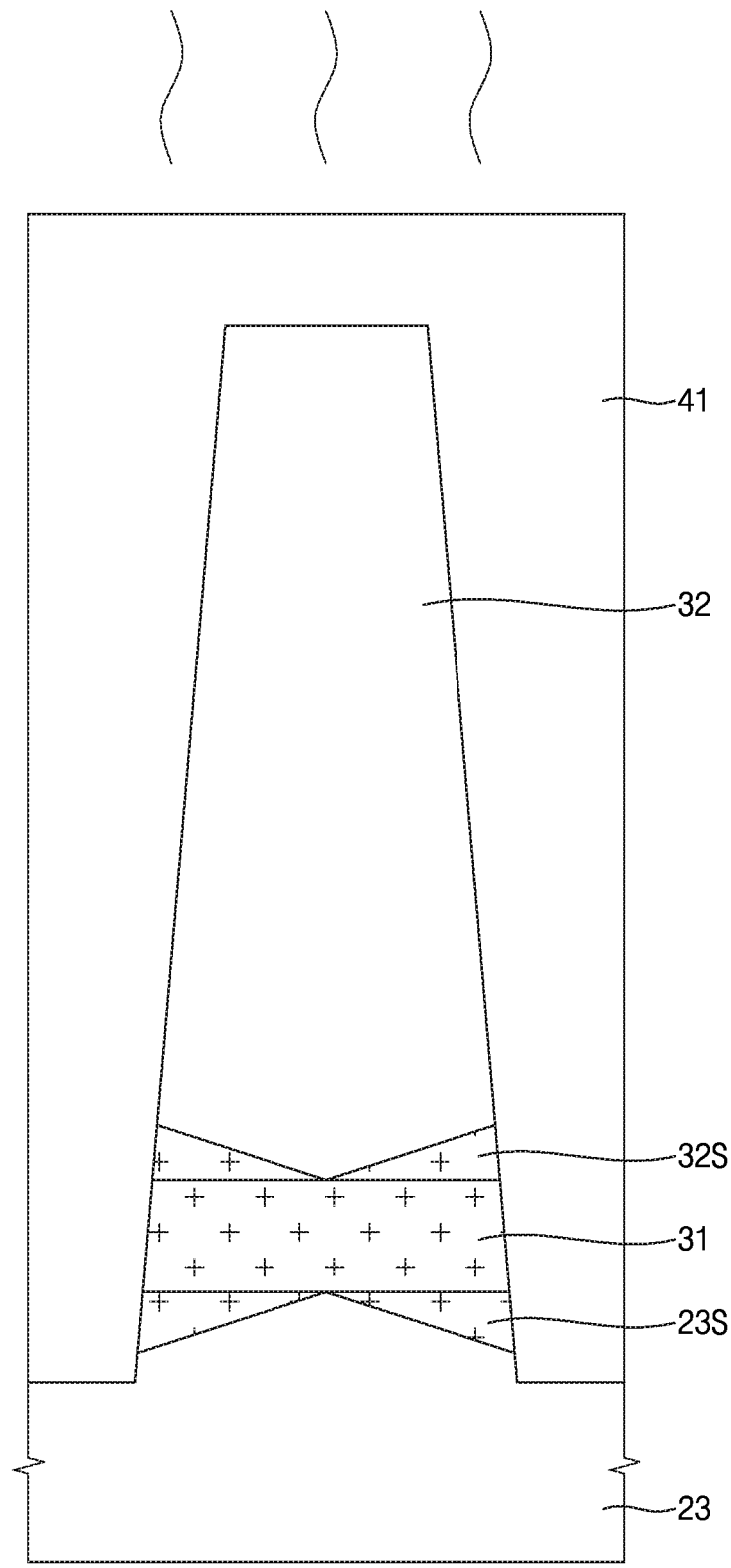
FIGS. 53 and 54 are cross-sectional views illustrating a method of forming a semiconductor device according to an example embodiment of the inventive concept.
Figure 54:
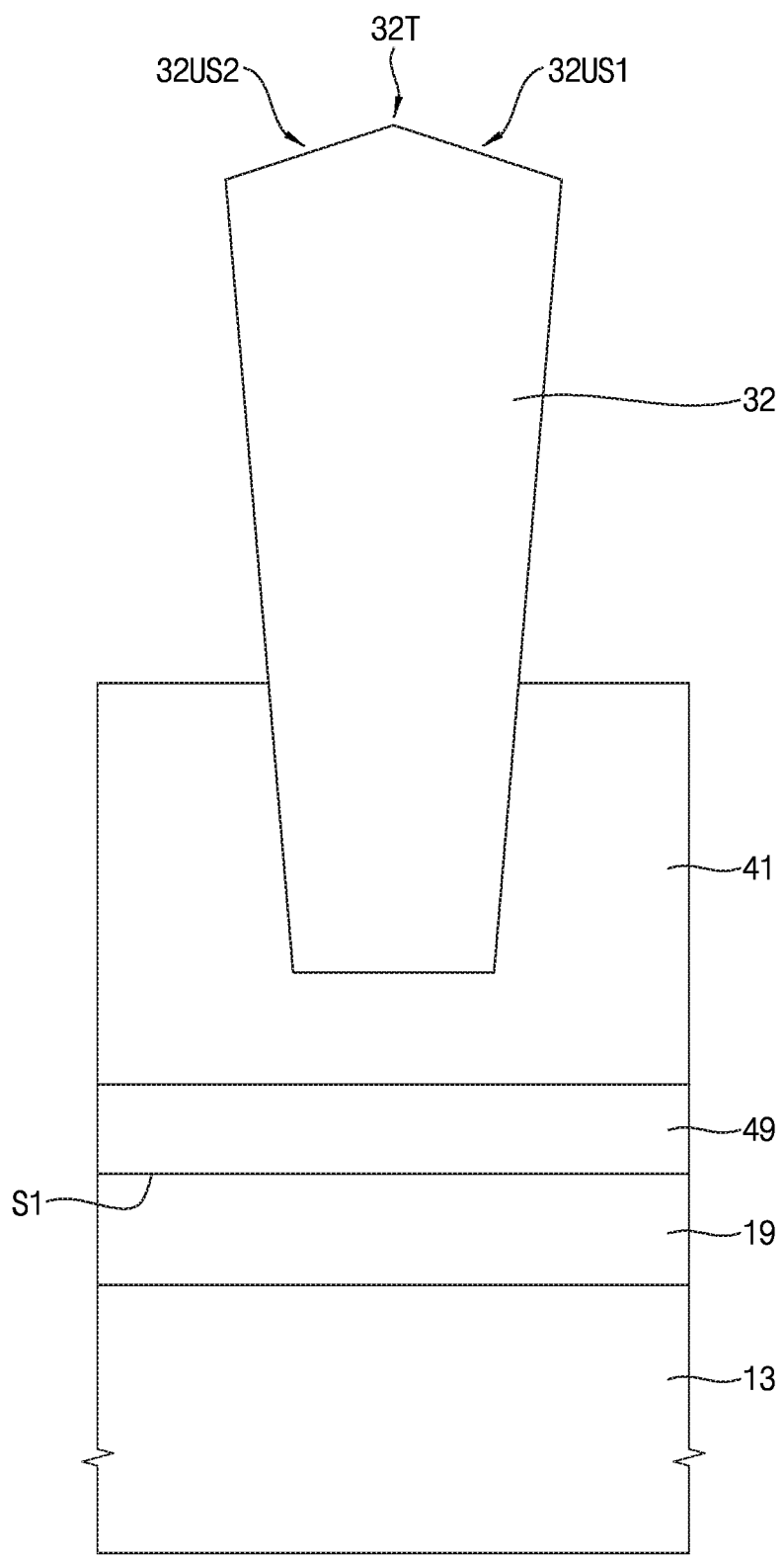

FIGS. 53 and 54 are cross-sectional views illustrating a method of forming a semiconductor device according to an example embodiment of the inventive concept.

Referring to FIG. 53, during a process of forming a sacrificial pattern 31, an active pattern 32 and a second substrate 23 may be partially oxidized to form a first sacrificial pattern 32S and a second sacrificial pattern 23S. The first sacrificial pattern 32S may be formed between the sacrificial pattern 31 and the active pattern 32. The first sacrificial pattern 32S may have a thickness that increases in a direction toward a boundary between a device isolation layer 41 and the sacrificial pattern 31. The first sacrificial pattern 32S may have a thickness that decreases in a direction toward a center of the sacrificial pattern 31. The second sacrificial pattern 23S may be formed between the sacrificial pattern 31 and the second substrate 23. The second sacrificial pattern 23S may have a thickness that increases in a direction toward the boundary between the device isolation layer 41 and the sacrificial pattern 31. The second sacrificial pattern 23S may have a thickness that decreases in the direction toward the center of the sacrificial pattern 31. The first sacrificial pattern 32S and the second sacrificial pattern 23S may include, for example, silicon oxide.

Referring to FIG. 54, the first sacrificial pattern 32S and the second sacrificial pattern 23S may be completely removed during a process of removing the sacrificial pattern 31. The device isolation layer 41 may be partially removed to partially expose side surfaces of the active pattern 32.

An upper surface of the active pattern 32 may have converging surfaces. In some embodiments, the upper surface of the active pattern 32 may include a first inclined surface 32US1, a second inclined surface 32US2, and a cusp 32T at which the first inclined surface 32US1 meets the second inclined surface 32US2. The second inclined surface 32US2 may be inclined in a direction opposite to the first inclined surface 32US1. The cusp 32T may be at or adjacent to a center of the active pattern 32. In some embodiments, the cusp 32T may be at or adjacent to a center of the active pattern 32 in a width direction of the active pattern 32 as illustrated in FIG. 54. The cusp 32T may protrude upward. An interface S1 may be defined between a first bonding layer 19 and a second bonding layer 49. Each of the first inclined surface 32US1 and the second inclined surface 32US2 may be spaced farther away from the interface S1 in a direction toward the cusp 32T. Each of the first inclined surface 32US1 and the second inclined surface 32US2 may become closer to the interface S1 in a direction away from the cusp 32T.

It will be understood that the first inclined surface 32US1 and the second inclined surface 32US2 can be referred to as converging surfaces, and the cusp 32T can be referred to as a converging edge. As illustrated in FIG. 54, in some embodiments, the first inclined surface 32US1 and the second inclined surface 32US2 may converge toward the cusp 32T and contact each other at the cusp 32T. The first inclined surface 32US1 and the second inclined surface 32US2 may converge in a direction away from the first bonding layer 19.

According to the example embodiments of the inventive concept, a first substrate having a first bonding layer may be provided. A sacrificial layer and an active layer may be sequentially formed on a second substrate using an epitaxial growth process. The sacrificial layer and the active layer may be patterned to form a preliminary sacrificial pattern and an active pattern. The preliminary sacrificial pattern may be oxidized to form a sacrificial pattern. A second bonding layer may be formed on the active pattern. The second bonding layer may be bonded onto the first bonding layer. The second substrate and the sacrificial pattern may be removed to expose the active pattern. The sacrificial pattern may serve as an etch stop layer during the removal of the second substrate. A semiconductor device, which has improved electrical characteristics and is advantageous for increasing mass production efficiency, may be formed.

While some example embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A method of forming a semiconductor device, the method comprising:
    providing a first substrate and a first bonding layer that is provided on the first substrate;
    forming a sacrificial pattern and an active pattern on a second substrate;
    forming a second bonding layer on the active pattern;
    bonding the second bonding layer onto the first bonding layer;
    removing the second substrate; and
    removing the sacrificial pattern to expose the active pattern,
    wherein forming the sacrificial pattern and the active pattern on the second substrate comprises:
        forming a preliminary sacrificial pattern and the active pattern on the second substrate, wherein the preliminary sacrificial pattern and the active pattern are sequentially stacked on the second substrate; and
        oxidizing the preliminary sacrificial pattern.

2. The method of claim 1, wherein the second substrate comprises a first portion and a second portion extending between the first portion of the second substrate and the sacrificial pattern, and
    wherein removing the second substrate comprises:
        removing the first portion of the second substrate using a chemical mechanical polishing (CMP) process; and then
        removing the second portion of the second substrate using an etching process until the sacrificial pattern is exposed.

3. The method of claim 1, wherein the active pattern has a width that decreases in a direction toward the first bonding layer.

4. The method of claim 1, wherein the active pattern comprises:
    converging surfaces; and
    a converging edge at which the converging surfaces contact each other,
    wherein the converging edge is adjacent to a center of the active pattern, and
    the converging surfaces converge in a direction away from the first bonding layer.

5. The method of claim 1, further comprising forming a device isolation layer on the preliminary sacrificial pattern and the active pattern before oxidizing the preliminary sacrificial pattern.

6. The method of claim 1, wherein the active pattern comprises a silicon (Si) layer, and
    the sacrificial pattern comprises a silicon germanium oxide (SiGeO) layer.

7. The method of claim 1, wherein forming the sacrificial pattern and the active pattern comprises:

forming a plurality of sacrificial layers and a plurality of active layers on the second substrate using an epitaxial growth process, wherein the plurality of sacrificial layers and the plurality of active layers are alternately stacked on the second substrate;

patterning the plurality of sacrificial layers and the plurality of active layers to form a plurality of preliminary sacrificial patterns and a plurality of active patterns; and oxidizing the plurality of preliminary sacrificial patterns.

8. The method of claim 7, wherein the plurality of active patterns comprise:

a first active pattern on the second bonding layer; and
a second active pattern between the second bonding layer and the first active pattern,
wherein a widest width of the second active pattern is smaller than a widest width of the first active pattern.

9. The method of claim 7, further comprising forming a stressor on the plurality of active patterns before forming the second bonding layer, wherein the stressor is between the plurality of active patterns and the second bonding layer.

10. The method of claim 9, wherein the plurality of active patterns comprise a third active pattern that is closest to the first bonding layer among the plurality of active patterns, and wherein the third active pattern is in the stressor.

11. The method of claim 10, wherein the third active pattern has a width that decreases in a direction toward the first bonding layer.

12. The method of claim 1, wherein removing the second substrate comprising etching the second substrate using the sacrificial pattern as an etch stopper.

13. A method of forming a semiconductor device, the method comprising:

providing a first substrate and a first bonding layer that is provided on the first substrate;

forming a sacrificial pattern and an active pattern on a second substrate;

forming a second bonding layer on the active pattern;

bonding the second bonding layer onto the first bonding layer;

removing the second substrate; and removing the sacrificial pattern to expose the active pattern, wherein forming the sacrificial pattern and the active pattern on the second substrate comprises:
sequentially forming a sacrificial layer and an active layer on the second substrate using a first epitaxial growth process;
patterning the sacrificial layer and the active layer to form a preliminary sacrificial pattern and the active pattern; and
oxidizing the preliminary sacrificial pattern.

14. The method of claim 13, further comprising forming a stressor on the active pattern before forming the second bonding layer, wherein the stressor comprises a silicon germanium (SiGe) layer, a silicon carbide (SiC) layer, a silicon (Si) layer, a silicon nitride layer, a silicon oxynitride layer, or a combination thereof.

15. The method of claim 13, further comprising forming a stressor on the active pattern before forming the second bonding layer, wherein the active pattern extends into the stressor.

16. The method of claim 13, further comprising:

forming a device isolation layer on the preliminary sacrificial pattern and the active pattern before oxidizing the preliminary sacrificial pattern; and forming a stressor on the active pattern before forming the second bonding layer, wherein forming the stressor comprises:
partially removing the device isolation layer to expose the active pattern; and
forming the stressor on the active pattern using a second epitaxial growth process.

17. The method of claim 13, further comprising forming a gate electrode that traverses the active pattern.

18. A method of forming a semiconductor device, the method comprising:

providing a first substrate and a first bonding layer that is provided on the first substrate;

sequentially forming a sacrificial pattern, an active pattern, and a second bonding layer on a second substrate, wherein the second substrate comprises a first portion and a second portion extending between the first portion of the second substrate and the sacrificial pattern;

bonding the second bonding layer onto the first bonding layer;

removing the first portion of the second substrate using a first process and then removing the second portion of the second substrate using a second process until the sacrificial pattern is exposed; and removing the sacrificial pattern until the active pattern is exposed, wherein forming the sacrificial pattern and the active pattern on the second substrate comprises:
sequentially forming a sacrificial layer and an active layer on the second substrate using an epitaxial growth process;
patterning the sacrificial layer and the active layer to form a preliminary sacrificial pattern and the active pattern on the second substrate, wherein the preliminary sacrificial pattern and the active pattern are sequentially stacked on the second substrate; and
oxidizing the preliminary sacrificial pattern.

19. The method of claim 18, wherein the first process comprises a chemical mechanical polishing (CMP) process, and the second process comprises an etch process.

* * * * *